(12) United States Patent
Huang et al.

(10) Patent No.: US 10,459,159 B2
(45) Date of Patent: Oct. 29, 2019

(54) PHOTONIC PACKAGE AND METHOD FORMING SAME

(71) Applicant: Taiwan Semiconductor Manufacturing Company, Ltd., Hsinchu (TW)

(72) Inventors: Sung-Hui Huang, Dongshan Township (TW); Jui Hsieh Lai, Taoyuan (TW); Tien-Yu Huang, Shuishang Township (TW); Wen-Cheng Chen, Hsinchu (TW); Yushun Lin, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/390,565

(22) Filed: Apr. 22, 2019

(65) Prior Publication Data

US 2019/0250327 A1 Aug. 15, 2019

Related U.S. Application Data

(63) Continuation of application No. 15/725,911, filed on Oct. 5, 2017, now Pat. No. 10,267,988.

(60) Provisional application No. 62/527,185, filed on Jun. 30, 2017.

(51) Int. Cl.
| | | |
|---|---|---|
| *G02B 6/12* | (2006.01) |
| *G02B 6/42* | (2006.01) |
| *G02B 6/30* | (2006.01) |
| *G02B 6/34* | (2006.01) |
| *G02B 6/43* | (2006.01) |
| *G02B 6/13* | (2006.01) |

(52) U.S. Cl.
CPC ..... *G02B 6/12002* (2013.01); *G02B 6/12004* (2013.01); *G02B 6/13* (2013.01); *G02B 6/30* (2013.01); *G02B 6/34* (2013.01); *G02B 6/42* (2013.01); *G02B 6/428* (2013.01); *G02B 6/4214* (2013.01); *G02B 6/4239* (2013.01); *G02B 6/4274* (2013.01); *G02B 6/43* (2013.01)

(58) Field of Classification Search
None
See application file for complete search history.

(56) References Cited

U.S. PATENT DOCUMENTS

| | | |
|---|---|---|
| 4,163,953 A | 8/1979 | Springthorpe et al. |
| 5,400,419 A | 3/1995 | Heinen |

(Continued)

FOREIGN PATENT DOCUMENTS

| | | |
|---|---|---|
| DE | 10328265 A1 | 1/2005 |
| JP | 2014240933 A | 12/2014 |

(Continued)

*Primary Examiner* — Michelle R Connelly
(74) *Attorney, Agent, or Firm* — Slater Matsil, LLP

(57) ABSTRACT

A method includes bonding an electronic die to a photonic die. The photonic die includes an opening. The method further includes attaching an adapter onto the photonic die, with a portion of the adapter being at a same level as a portion of the electronic die, forming a through-hole penetrating through the adapter, with the through-hole being aligned to the opening, and attaching an optical device to the adapter. The optical device is configured to emit a light into the photonic die or receive a light from the photonic die.

20 Claims, 26 Drawing Sheets

(56) References Cited

U.S. PATENT DOCUMENTS

| | | | |
|---|---|---|---|
| 6,370,292 B1* | 4/2002 | Strake | G02B 6/10 |
| | | | 385/14 |
| 6,512,861 B2* | 1/2003 | Chakravorty | G02B 6/42 |
| | | | 385/14 |
| 7,061,106 B2 | 6/2006 | Yang et al. | |
| 7,700,956 B2 | 4/2010 | Fuergut et al. | |
| 8,831,437 B2 | 9/2014 | Dobbelaere et al. | |
| 9,551,844 B2 | 1/2017 | Tan et al. | |
| 10,267,988 B2* | 4/2019 | Huang | G02B 6/12004 |
| 2002/0071636 A1 | 6/2002 | Bazylenko et al. | |
| 2004/0022496 A1 | 2/2004 | Lam | |
| 2004/0126058 A1* | 7/2004 | Lu | G02B 6/43 |
| | | | 385/33 |
| 2004/0197054 A1 | 10/2004 | Tourne | |
| 2005/0226565 A1 | 10/2005 | Kautio et al. | |
| 2006/0182397 A1 | 8/2006 | Benner et al. | |
| 2006/0210213 A1* | 9/2006 | Huang | G02B 6/4206 |
| | | | 385/14 |
| 2010/0215314 A1 | 8/2010 | Lau et al. | |
| 2012/0263415 A1 | 10/2012 | Tan et al. | |
| 2013/0182997 A1 | 7/2013 | Fujiwara et al. | |
| 2013/0259421 A1 | 10/2013 | Yamakami et al. | |
| 2014/0314369 A1* | 10/2014 | Tseng | G02B 6/428 |
| | | | 385/14 |
| 2014/0321801 A1 | 10/2014 | Ellis-Monaghan et al. | |
| 2014/0321804 A1 | 10/2014 | Thacker et al. | |
| 2014/0341502 A1* | 11/2014 | Tseng | G02B 6/4204 |
| | | | 385/14 |
| 2014/0369642 A1 | 12/2014 | Yanagisawa | |
| 2015/0078711 A1 | 3/2015 | Ootorii | |
| 2015/0125110 A1 | 5/2015 | Anderson et al. | |
| 2015/0293305 A1 | 10/2015 | Nakagawa et al. | |
| 2015/0309261 A1 | 10/2015 | Kobyakov et al. | |
| 2016/0124166 A1 | 5/2016 | Braunisch et al. | |
| 2016/0216445 A1 | 7/2016 | Thacker et al. | |
| 2016/0313519 A1 | 10/2016 | Yanagisawa | |
| 2017/0131469 A1 | 5/2017 | Kobrinsky et al. | |
| 2017/0212307 A1 | 7/2017 | Jiang | |
| 2017/0219785 A1 | 8/2017 | Pinguet et al. | |
| 2017/0269305 A1 | 9/2017 | Heroux | |
| 2017/0285263 A1 | 10/2017 | Pinguet et al. | |
| 2018/0031786 A1 | 2/2018 | Aoki et al. | |
| 2018/0069634 A1 | 3/2018 | Peterson et al. | |
| 2018/0180808 A1 | 6/2018 | Zhang et al. | |
| 2018/0203187 A1 | 7/2018 | Doerr et al. | |

FOREIGN PATENT DOCUMENTS

| | | |
|---|---|---|
| JP | 2015060097 A | 3/2015 |
| WO | 2015082549 A1 | 6/2015 |

* cited by examiner

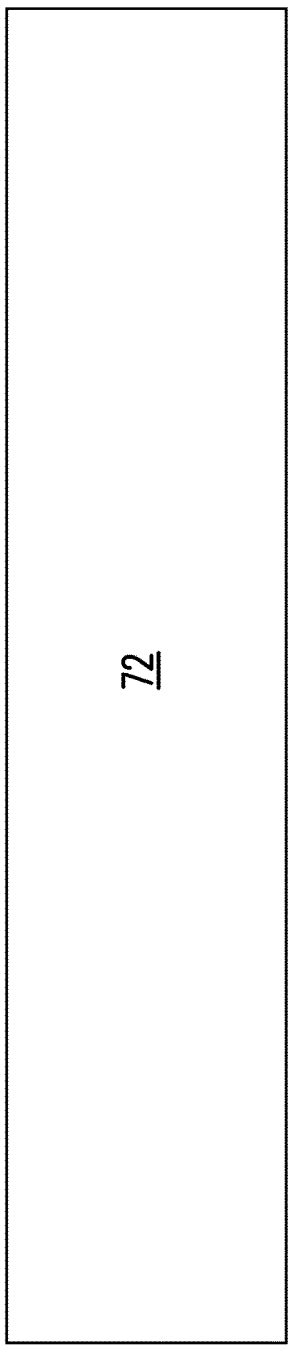
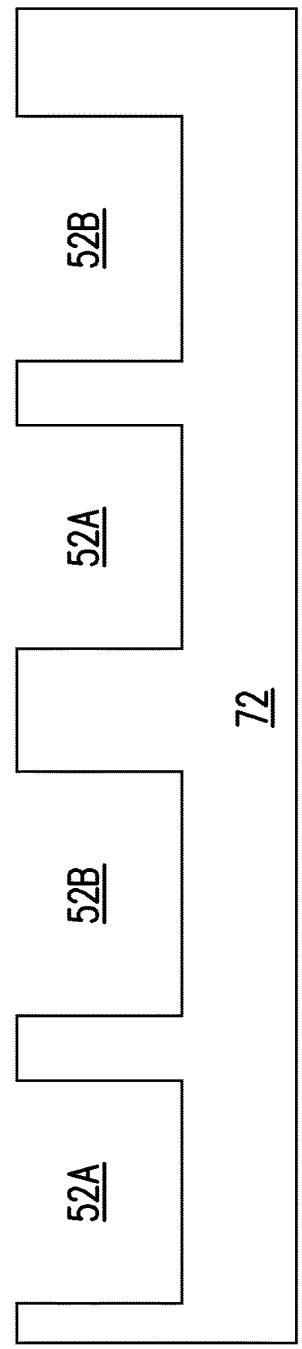

PHOTONIC PACKAGE AND METHOD FORMING SAME

PRIORITY CLAIM AND CROSS-REFERENCE

This application is a continuation of U.S. patent application Ser. No. 15/725,911, entitled "Photonic Package and Method Forming Same," filed on Oct. 5, 2017, which application claims the benefit of the following provisionally filed U.S. Patent application: Application Ser. No. 62/527,185, filed Jun. 30, 2017, and entitled "Photonic package and method forming same," which application is hereby incorporated herein by reference.

BACKGROUND

Electrical signaling and processing have been the mainstream techniques for signal transmission and processing. Optical signaling and processing have been used in increasingly more applications in recent years, particularly due to the use of optical fiber-related applications for signal transmission.

The optical signaling and processing are almost always combined with electrical signaling and processing to provide full-fledged applications. For example, the optical fibers may be used for long-range signal transmission, while electrical signals may be used for short-range signal transmission as well as processing and controlling. Accordingly, the devices integrating optical components and electrical components are formed for the conversion between optical signals and electrical signals, as well as the processing of optical signals and electrical signals. Packages thus may include both optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A through 6C illustrate the cross-sectional views of intermediate stages in the formation of adapters in accordance with some embodiments.

DETAILED DESCRIPTION

Figure 1A:
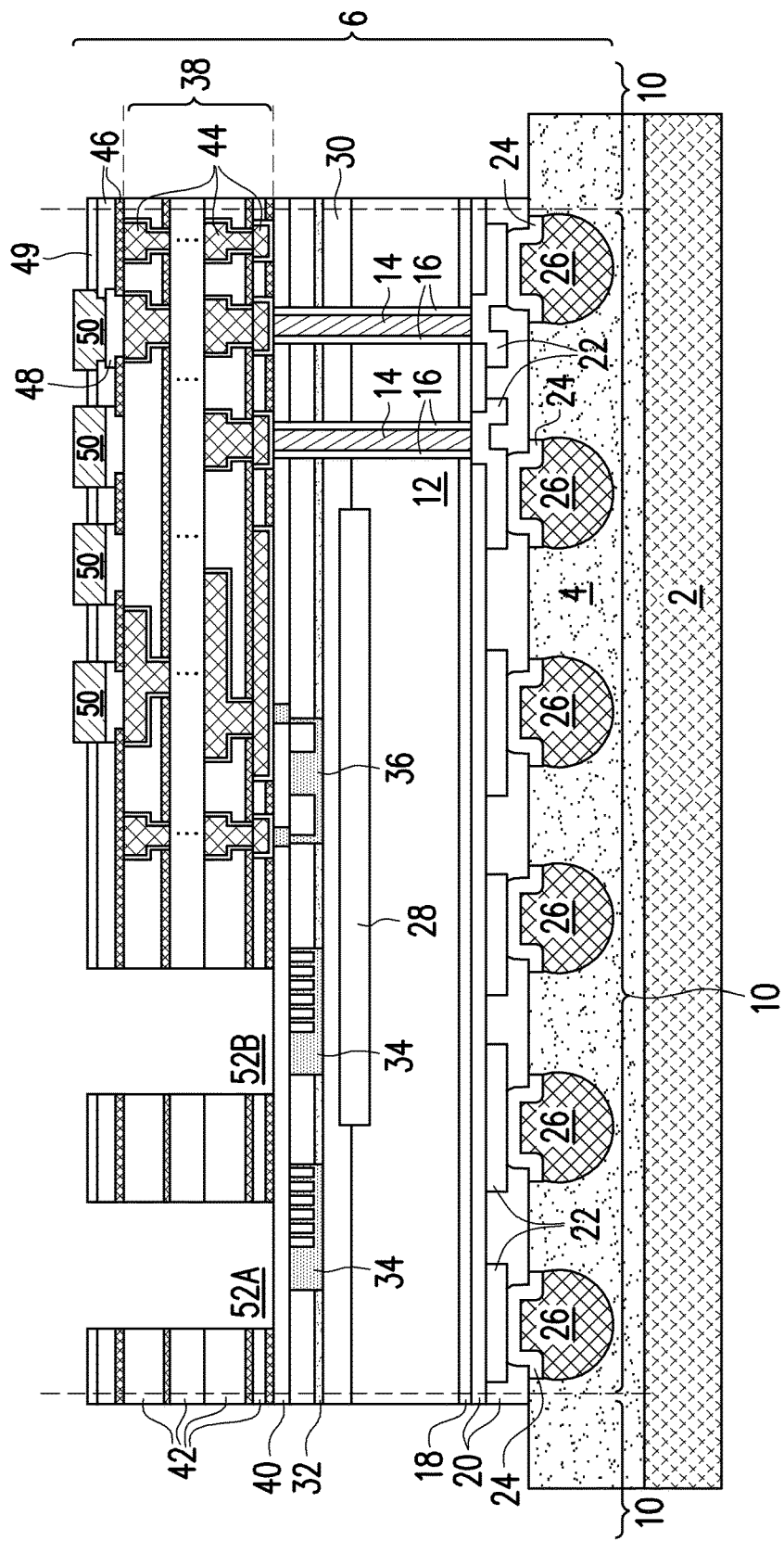
FIGS. 1A through 1G illustrate the cross-sectional views of intermediate stages in the formation of a chip-on-wafer package including both optical devices and electrical devices in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) package including both optical devices and electrical devices and the method of forming the same are provided in accordance with various exemplary embodiments. The intermediate stages of forming the packages are illustrated in accordance with some embodiments. Some variations of some embodiments are discussed. Throughout the various views and illustrative embodiments, like reference numbers are used to designate like elements.

Figure 10:
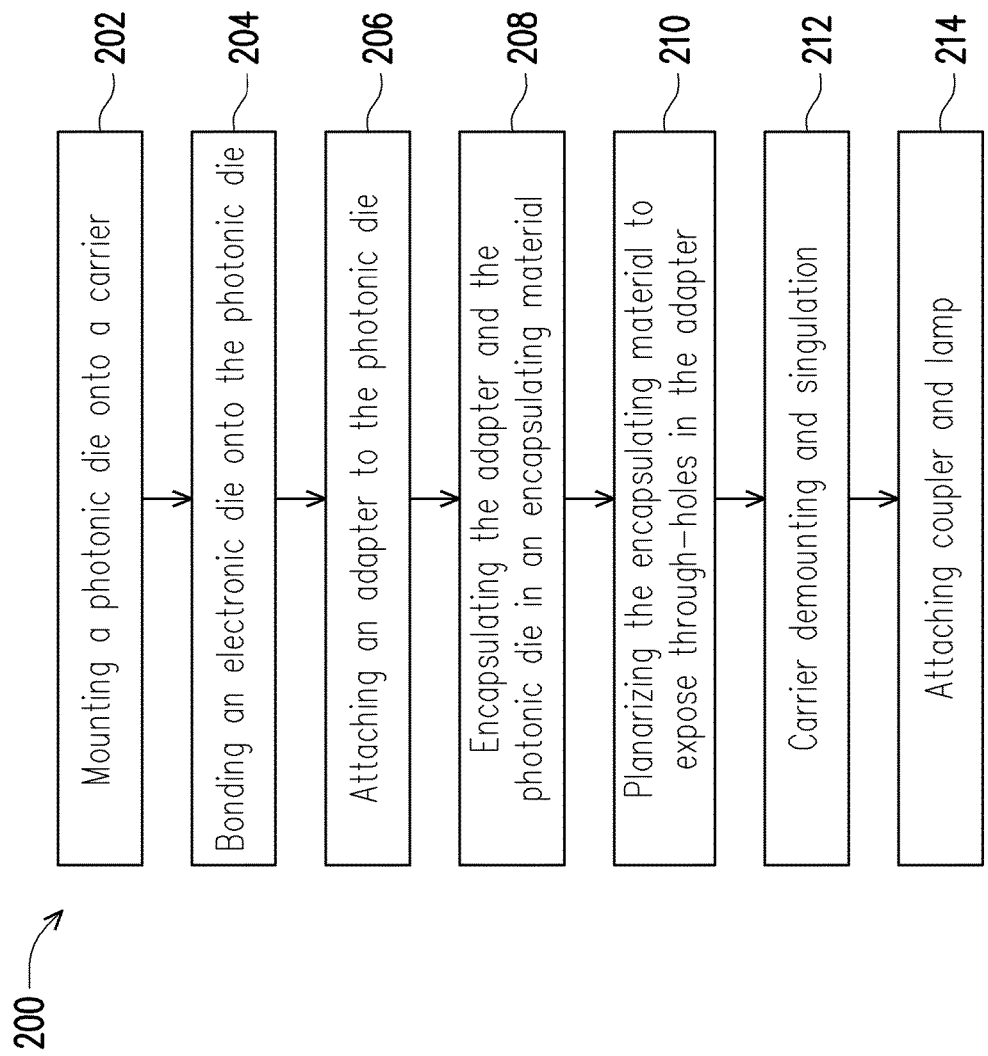
FIG. 10 illustrates a process flow for forming a chip-on-wafer package in accordance with some embodiments.

FIGS. 1A through 1G illustrate the cross-sectional views of intermediate stages in the formation of a package in accordance with some embodiments of the present disclosure. The steps shown in FIGS. 1A through 1G are also reflected schematically in the process flow 200 shown in FIG. 10.

FIG. 1A illustrates a cross sectional view of photonic die 10, which is mounted on carrier 2 through adhesive 4. The respective step is illustrated as step 202 in the process flow shown in FIG. 10. In accordance with some embodiments of the present disclosure, photonic die 10 is a part of wafer 6, which includes a plurality of identical photonic dies 10 arranged as an array, although one photonic die 10 is illustrated in detail. Photonic die 10 has the function of receiving optical signals, transmitting the optical signals inside photonic die 10, transmitting the optical signals out of photonic die 10, and communicating electronically with electronic die 54. Accordingly, photonic die 10 is also responsible for the Input-Output (IO) of the optical signals.

Photonic die 10 includes substrate 12. Substrate 12 may be a semiconductor substrate, which may be a silicon substrate, a silicon germanium substrate, or a substrate formed of other semiconductor materials. In accordance with alternative embodiments of the present disclosure, substrate 12 is a dielectric substrate formed of, for example, silicon oxide. In accordance with some embodiments of the present disclosure, photonic die 10 is used as an interposer, and includes Through-Vias (TVs, also referred to as through-substrate vias or through-silicon vias) 14 penetrating through substrate 12. TVs 14 are formed of a conductive material, which may also be a metallic material such as tungsten, copper, titanium, or the like. Isolation layers 16 encircle TVs 14, and electrically isolation TVs 14 from substrate 12.

The process shown in FIGS. 1A through 1G are referred to as a solder-first process, in which the backside structure (including solder regions 26) of photonic die 10 is formed first, as shown in FIG. 1A. In the structure shown in FIG. 1A, dielectric layer 18 is underlying substrate 12, and may be formed of silicon oxide, silicon nitride, silicon carbide, or other dielectric materials. TVs 14 may penetrate through dielectric layer 18. Redistribution Lines (RDLs) 22 are formed underlying and connected to TVs 14, and are used for rerouting electrical signals, power, electrical ground, or the like. Redistribution lines 22 are formed in dielectric layers 20. Under-Bump Metallurgies (UBMs) 24 are formed as being underlying and electrically connecting to RDLs 22, and solder regions 26 are formed on UBMs 24.

In accordance with some embodiments of the present disclosure, integrated circuit devices 28 may be formed at the top surface of substrate 12. In accordance with some embodiments of the present disclosure, integrated circuit devices 28 include active devices such as transistors and/or diodes (which may include photo diodes). Integrated circuit devices 28 may also include passive devices such as capacitors, resistors, or the like. In accordance with alternative embodiments of the present disclosure, no active devices are formed, while passive devices may be formed in photonic die 10.

Over substrate 12 resides dielectric layer 30 (which may also represent a plurality of dielectric layers). In accordance with some embodiments of the present disclosure, dielectric layer 30 is formed of silicon oxide, silicon nitride, or the like. Silicon layer 32 is formed over, and may contact, dielectric layer 30. Silicon layer 32 may be patterned, and is used to form the waveguides for the internal transmission of optical signals. Accordingly, silicon layer 32 is also referred to as waveguide(s) hereinafter. Grating couplers 34 are formed on silicon layer 32, and the top portions of grating couplers 34 have grating, so that grating couplers 34 have the function of receiving light or transmitting light. The grating couplers 34 used for receiving light receive the light from the overlying light source or optical signal source (such as optical fiber 84 as shown FIG. 1G) and transmit the light to waveguide 32. The grating couplers 34 used for transmitting light receives light from waveguide 32 and transmit light to fiber 84 (FIG. 1G). Modulator(s) 36 are also formed on silicon layer 32, and are used for modulating the optical signals. It is appreciated that photonic die 10 may include various other devices and circuits that may be used for processing and transmitting optical signals and electrical signals, which are also contemplated in accordance with some embodiments of the present disclosure.

FIG. 1A also illustrates interconnect structure 38 formed over grating couplers 34. Interconnect structure 38 includes a plurality of dielectric layers 40 and 42 and metal lines and vias (in combination referred to as 44) therein. Dielectric layer 40 is formed of a light-transparent material such as silicon oxide. Dielectric layers 42 are also referred to as Inter-Metal Dielectrics (IMDs), and may be formed of silicon oxide, silicon oxynitride, silicon nitride, or the like, or low-k dielectric materials having k values lower than about 3.0. The low-k dielectric materials may include Black Diamond (a registered trademark of Applied Materials), a carbon-containing low-k dielectric material, Hydrogen SilsesQuioxane (HSQ), MethylSilsesQuioxane (MSQ), or the like. Etch stop layers may be formed to separate neighboring IMDs, and are formed of a material(s) having a high etching selectivity relative to the dielectric layers. The etch stop layers may be formed of silicon carbide, silicon carbonitride, etc. Metal lines and vias 44 may be formed using damascene processes, and may include, for example, copper on diffusion barrier layers. The diffusion barrier layers may be formed of titanium, titanium nitride, tantalum, tantalum nitride, or the like. In accordance with some embodiments, TVs 14 extend to metal lines 44 in the bottom dielectric layer in dielectric layers 42.

Metal pads 48 are formed over and connected to metal lines/vias 44. Passivation layers 46 may be formed, with at least some portions of passivation layers 46 covering the edge portions of metal pads 48. Metal pads 48 may be formed of aluminum copper, and hence are referred to as aluminum pads since the majority elements in metal pads 48 are aluminum. Metal pads 48 are electrically connected to the electrical devices (such as devices 28) and/or through-vias 14 through metal lines and vias 44, which electrical devices may be light-to-electrical conversion devices and/or electrical-to-light conversion devices. The light-to-electrical conversion devices and/or electrical-to-light conversion devices may be built inside photonic die 10 or external to and attached to photonic die 10. The light-to-electrical conversion devices may include photo diodes. The electrical-to-light conversion devices may include light emitting didoes, lamps, or the like.

Passivation layers 46 may be formed of non-low-k dielectric materials. For example, a passivation layer 46 may include a silicon oxide layer and a silicon nitride layer over the silicon oxide layer. Polymer layers such as PBO, polyimide, or the like may or may not be used to form the top dielectric layers such as layer 49, which is overlying dielectric layers 46. Electrical connectors 50 are formed at the top surface of photonic die 10. In accordance with some embodiments of the present disclosure, electrical connectors 50 are formed of copper, nickel, titanium, or multi-layers thereof, and may be formed as metal pillars. Electrical connectors 50 may also include solder caps (not shown).

Holes 52A and 52B are formed in photonic die 10, and penetrate through a plurality of dielectric layers including layers 49, 46, and 42. Holes 52A and 52B are also collectively and individually referred to as holes (or openings) 52. The formation of holes 52 includes an etching process using a photo lithography process. Holes 52 extend to the top surface of dielectric layer 40, with at least a portion of dielectric layer 40 located directly underlying each of holes 52. In accordance with some embodiments of the present disclosure, holes 52 overlap the underlying grating couplers 34. The top view shapes of holes 52 may include, and are not limited to, rectangles, circles, hexagons, or the like. It is appreciated that although one hole 52A and one hole 52B are illustrated, there may be a plurality of holes 52A and/or a plurality holes 52B. In accordance with some embodiments in which dielectric layers 42 include low-k dielectric materials, holes 52 may be passivated by covering the sidewalls of holes 52 with a conformal non-low-k dielectric layer (not shown) so that the low-k dielectric materials are not exposed.

Figure 1B:
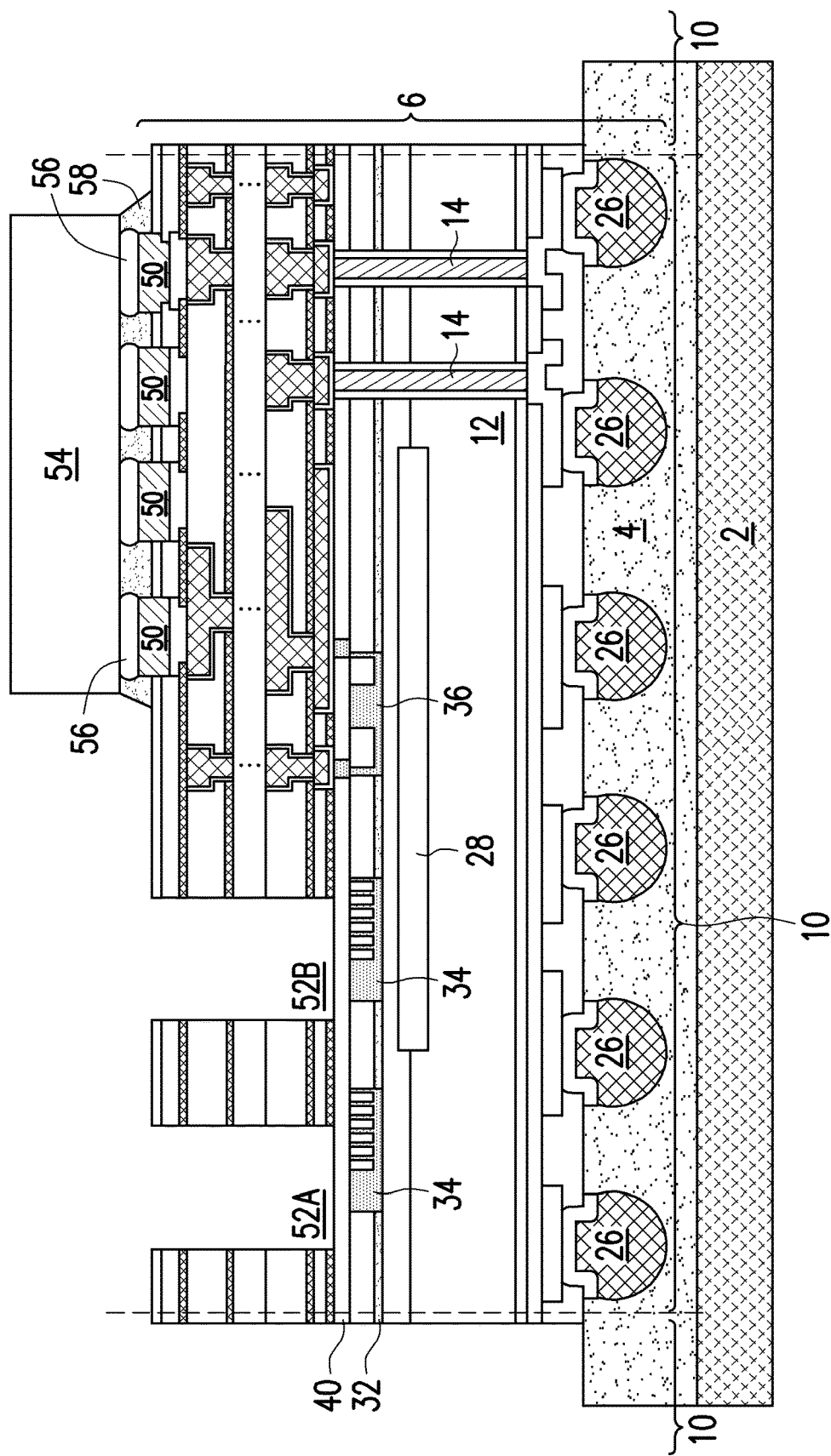

Referring to FIG. 1B, electronic die 54 is bonded to photonic die 10. The respective step is illustrated as step 204 in the process flow shown in FIG. 10. The bonding may be achieved through, for example, solder bonding using solder regions 56. Other bonding methods such as direct metal-to-metal bonding or hybrid bonding may also be used. Underfill 58 may be dispensed into the gap between electronic die 54 and photonic die 10, and is then cured.

In accordance with some embodiments of the present disclosure, electronic die 54 acts as a central processing unit, which includes the controlling circuit for controlling the operation of the devices in photonic die 10. Electronic die 54 also exchanges electrical signals with photonic die 10 through bonding regions (such as solder regions 56). In addition, electronic die 54 includes the circuits for processing the electrical signals converted from the optical signals in photonic die 10.

Figure 1C:
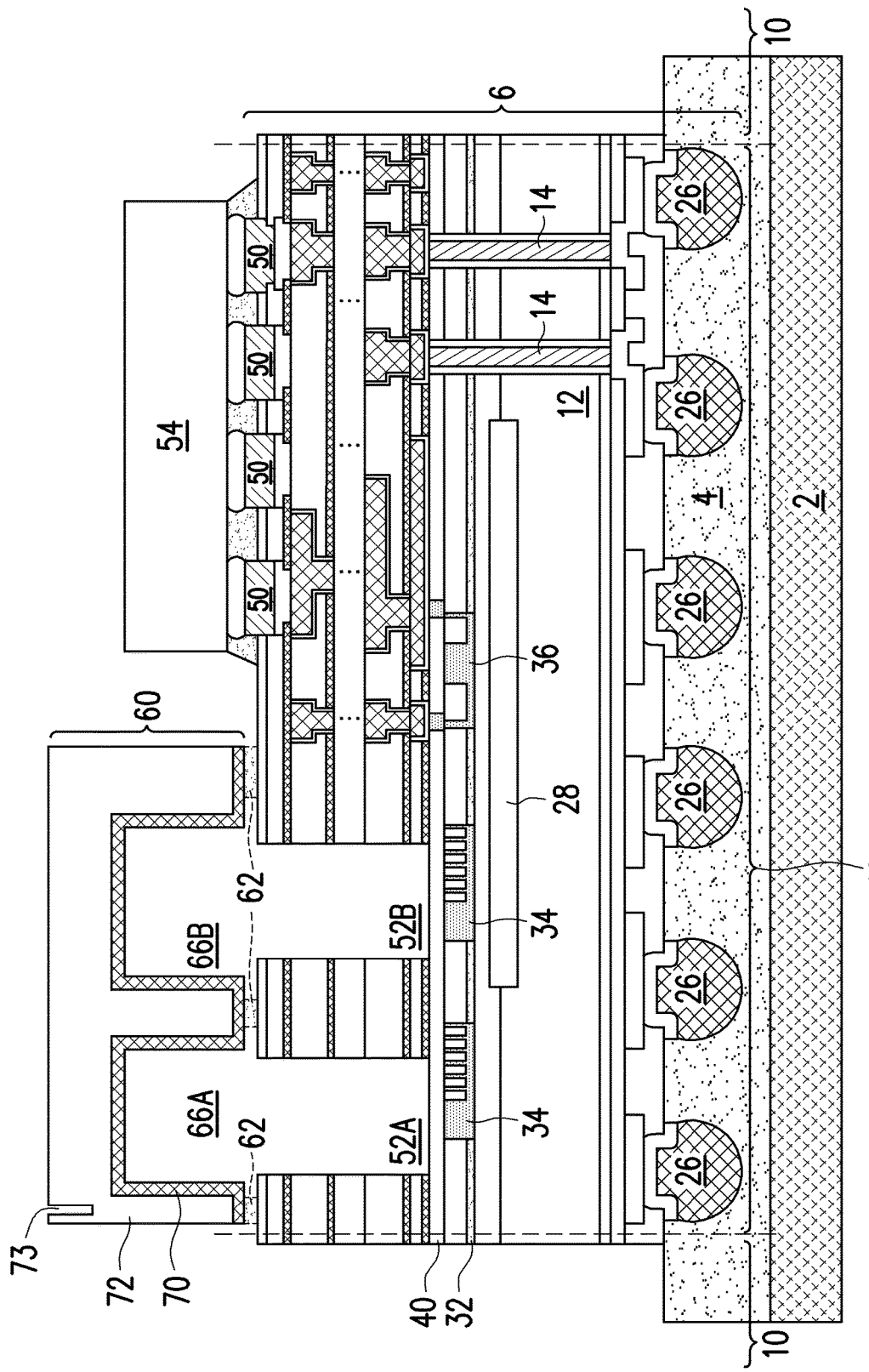

In a subsequent step, as shown in FIG. 1C, adapter 60 is attached to photonic die 10. The respective step is illustrated as step 206 in the process flow shown in FIG. 10. In accordance with some embodiments of the present disclosure, adapter 60 is attached to photonic die 10 through adhesive 62. In accordance with alternative embodiments of the present disclosure, adapter 60 is attached to photonic die 10 through bonding, for example, fusion bonding (dielectric-to-dielectric) bonding. The bonding may be achieved through, for example, silicon-to-oxide bonding or oxide-to-oxide bonding, in which the oxide may include oxygen atoms. In the bonding, alignment mark(s) 73 in adapter 60 is used for aligning adapter 60 to photonic die 10, so that holes 66A and 66B (collectively or individually referred to as holes or openings 66) in adapter 60 are aligned to the respective underlying holes 52A and 52B, respectively. In accordance with some embodiments of the present disclosure, holes 66 have lateral dimensions greater than the lateral dimensions of the corresponding underlying holes 52. Holes 66 may extend laterally beyond the edges of the corresponding underlying holes 52. Holes 66A and the underlying holes 52A may have a one-to-one correspondence, with each of holes 66A overlapping one hole 52A. Holes 66A and the underlying holes 52A may have a one-to-many correspondence, with each of holes 66A overlapping a plurality of (two or more) holes 52A. Holes 66B and the underlying holes 52B may have a one-to-one correspondence, with each of holes 66B overlapping one hole 52B. Holes 66B and the underlying holes 52B may also have a one-to-many correspondence, with each of holes 66B overlapping a plurality of (two or more) holes 52B.

Figure 1D:
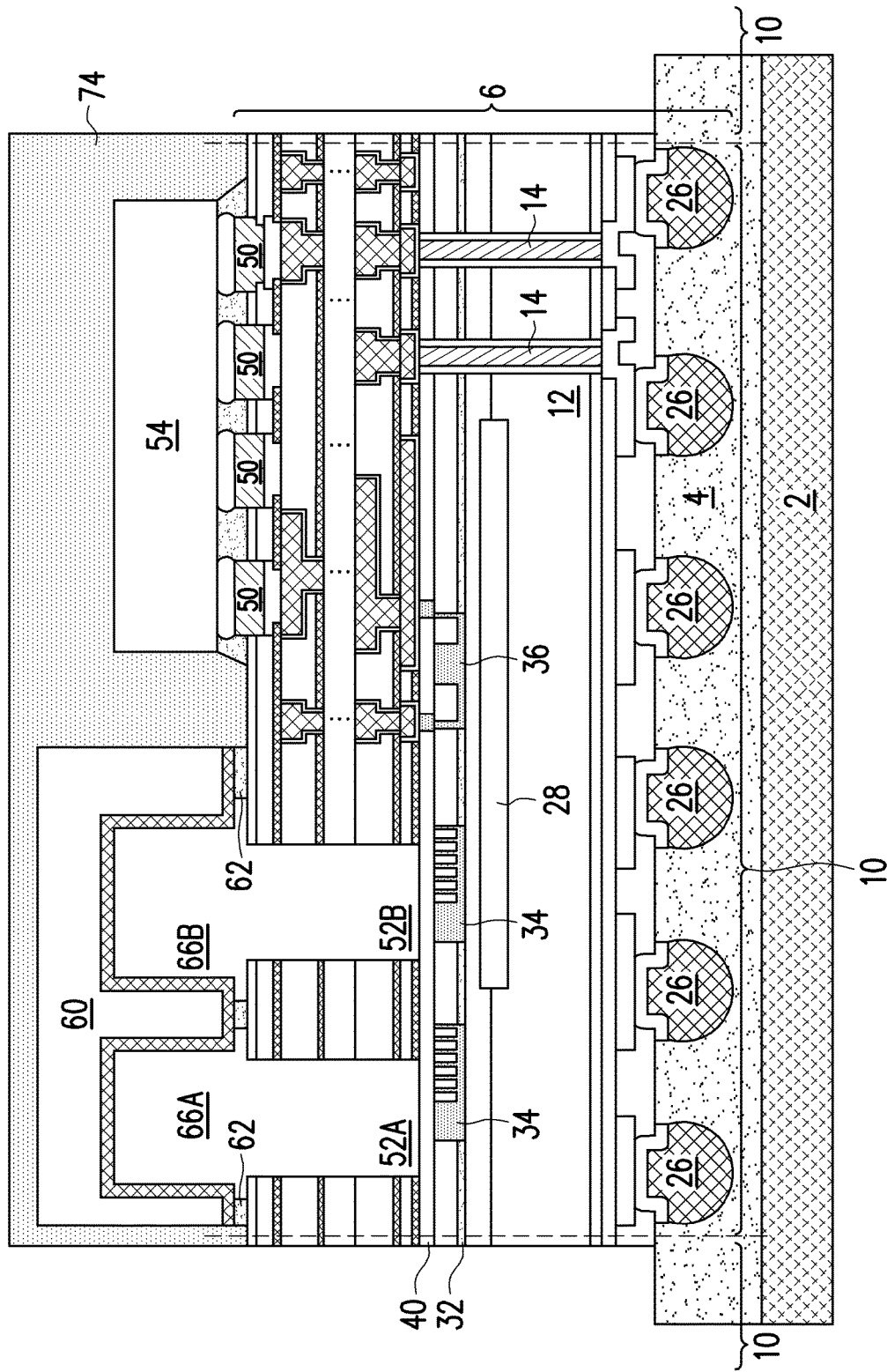
Figure 6C:
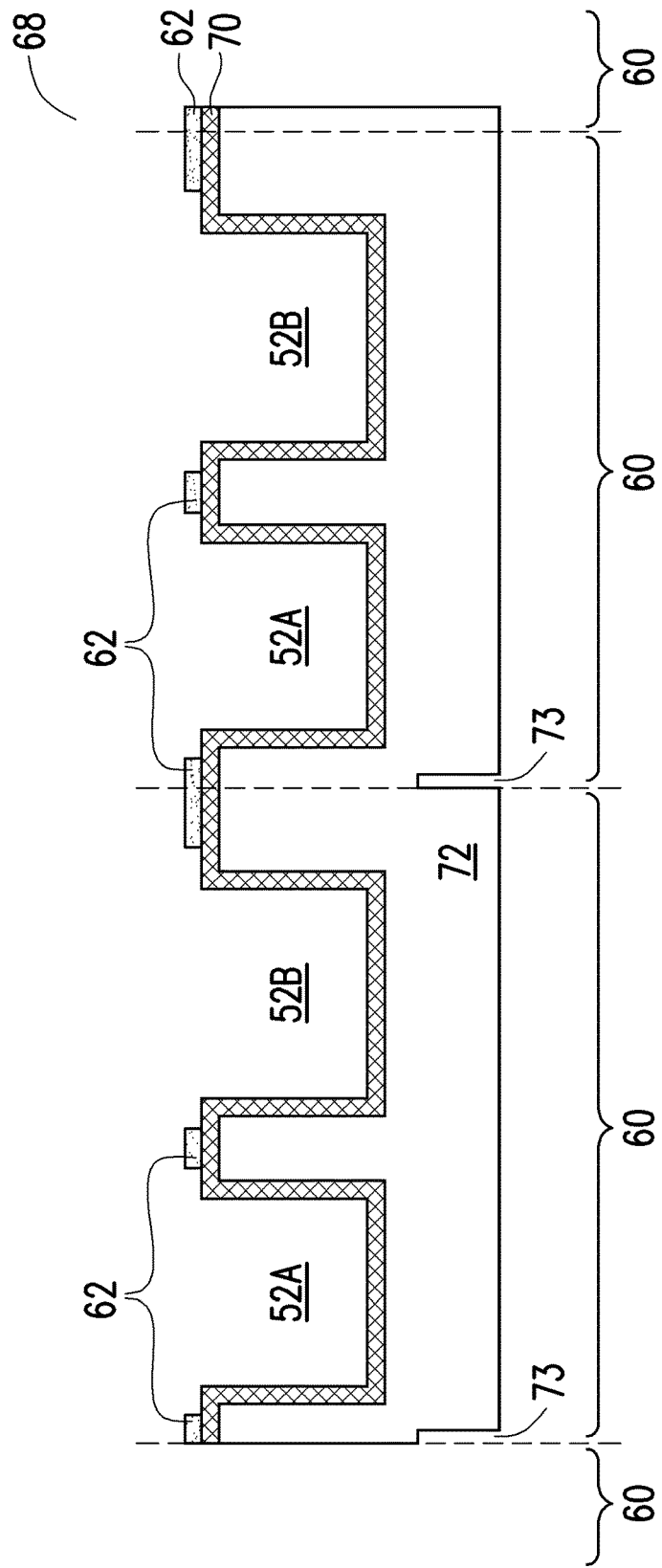

FIGS. 6A through 6C illustrate the cross-sectional view of intermediate stages in the formation of adapter 60 in accordance with some embodiments of the present disclosure. Referring to FIG. 6A, blank plate 68 is provided. In accordance with some embodiments of the present disclosure, blank plate 68 is formed of a homogenous material 72. Also, there is no active devices and passive devices formed on blank plate 68. Blank plate 68 may be formed of a semiconductor material, a dielectric material, or a metallic material. Blank plate 68 may also be formed of a material having a Coefficient of Thermal Expansion (CTE) smaller than the CTE of the encapsulating material 74 (FIG. 1D). The CTE of blank plate 68 may also be equal to or close to the CTE of silicon (around 2.6 ppm/° C.), or between the CTE of silicon and the CTE of the encapsulating material 74. In accordance with some embodiments of the present disclosure, blank plate 68 is formed of a semiconductor material such as silicon, and may be in the form of a blank silicon wafer. In accordance with alternative embodiments, blank plate 68 is formed of a dielectric material such as silicon oxide or silicon nitride (with CTE equal to about 3.2 ppm/° C.). In accordance with yet alternative embodiments, blank plate 68 is formed of a metallic material such as copper (with CTE equal to about 8.4 ppm/° C.), aluminum, stainless steel, or the like.

Referring to FIG. 6B, holes 52A and 52B are formed to extend from the top surface of blank plate 68 to an intermediate level in blank plate 68. Holes 52A and 52B may be formed through etching. The etching is anisotropic, so that the sidewalls of holes 52A and 52B are straight and vertical.

Next, referring to FIG. 6C, liner 70 is formed on base material 72. When plate 68 is a silicon plate or silicon wafer, liner 70 may be formed through the thermal oxidation of plate 68, and hence liner 70 is a silicon oxide layer. In accordance with these embodiments, liner 70 may also be formed on the sidewalls and the bottom surface of plate 68, which portions of liner 70 are not shown. In accordance with some embodiments of the present disclosure, liner 70 is formed through deposition, and liner 70 may include silicon oxide, silicon nitride, or the like. Liner 70 may be a single layer formed of a homogenous material such as silicon oxide, or may be a composite layer including a plurality of sub layers formed of different materials. For example, Liner 70 may include a silicon oxide layer, and a titanium nitride layer over the silicon oxide layer. The formation may be performed using a conformal deposition method such as Atomic Layer Deposition (ALD), Chemical Vapor Deposition (CVD), or the like.

Adhesive film 62 may be formed on the top surface of liner 70 in accordance with some embodiments for the subsequent attachment. In accordance with alternative embodiments, adhesive film 62 is not formed. Furthermore, alignment marks 73 are formed. It is noted that alignment marks may be notches extending into plate 68. Next, plate 68 is sawed apart into a plurality of identical adapters 60, and one of the adapters 60 is attached to photonic die 10, as shown in FIG. 1C. When adapter 60 is attached to photonic die 10 through fusion bonding, no adhesive is disposed on plate 68. Accordingly, adhesive 62 in FIG. 1C is illustrated as dashed to indicate it may or may not be present.

Figure 7A:
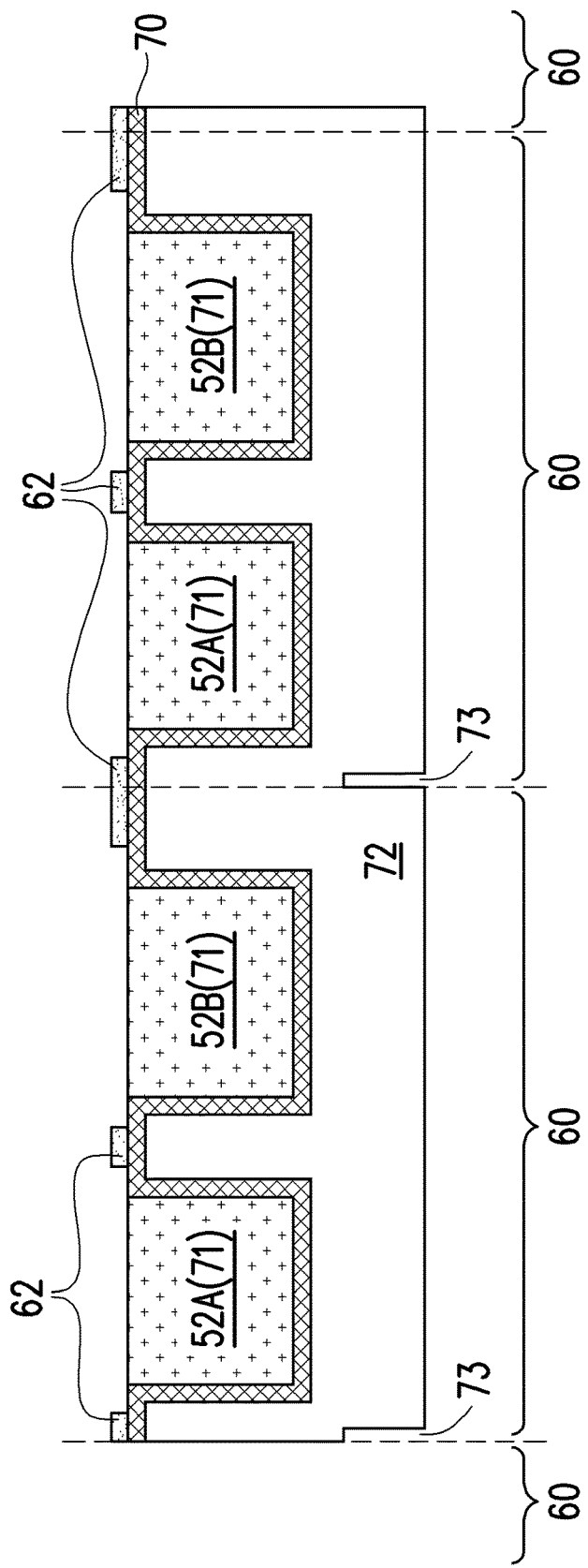
FIG. 7A illustrates the cross-sectional view in the formation of an adapter in accordance with some embodiments.

FIG. 7A illustrates the formation of adapters 60 in accordance with alternative embodiments. The initial structures, materials, and process steps are also the same as shown in FIGS. 6A and 6B. Next, as shown in FIG. 7A, liner 70 and transparent filling material 71 are formed, and the top surface of liner 70 and transparent filling material 71 may be planarized, for example, in a Chemical Mechanical Polish (CMP) or mechanical grinding. Transparent filling material 71 has a first refractive index ($n_1$) greater than a second refractive index ($n_2$) of liner 70. Accordingly, transparent filling material 71 may be used to transmit light, and total reflection may occur in transparent filling material 71 when the light transmitted in transparent filling material 71 reaches the liner 70. In accordance with some embodiments of the present disclosure, transparent filling material 71 is formed of silicon oxide, silicon nitride, silicon, glass, or the like, and the formation methods may include deposition or spin-on coating. After the planarization of liner 70 and transparent filling material 71, plate 68 is sawed into adapters 60. Adhesive may or may not be disposed on plate 68, depending on the material of liner 70 and the intended method for attaching adapter 60 onto photonic die 10.

Figure 7B:
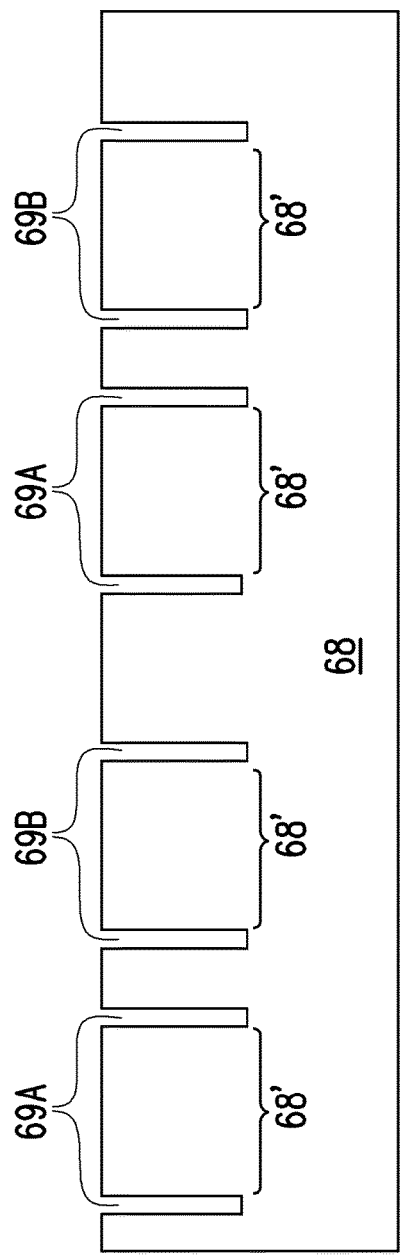
FIGS. 7B through 7G illustrate the top views and cross-sectional views of intermediate stages in the formation of an adapter in accordance with some embodiments.
Figure 7C:
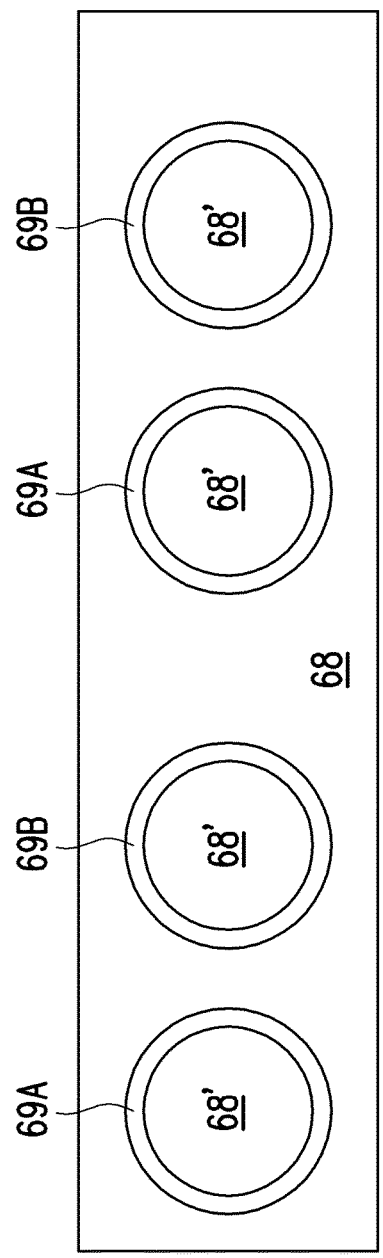

FIGS. 7B through 7G illustrate the top views and cross-sectional views in the formation of adapters 60 in accordance with alternative embodiments. Referring to FIG. 7B, which is a cross-sectional view, semiconductor plate 68 is provided. Semiconductor plate 68 may be a silicon substrate, or may be formed of other transparent semiconductor materials. Openings 69A and 69B are formed in semiconductor plate 68, for example, through etching. FIG. 7C illustrates a top view of semiconductor plate 68. Openings 69A and 69B each forms a ring encircling a portion 68' of semiconductor plate 68.

Figure 7D:
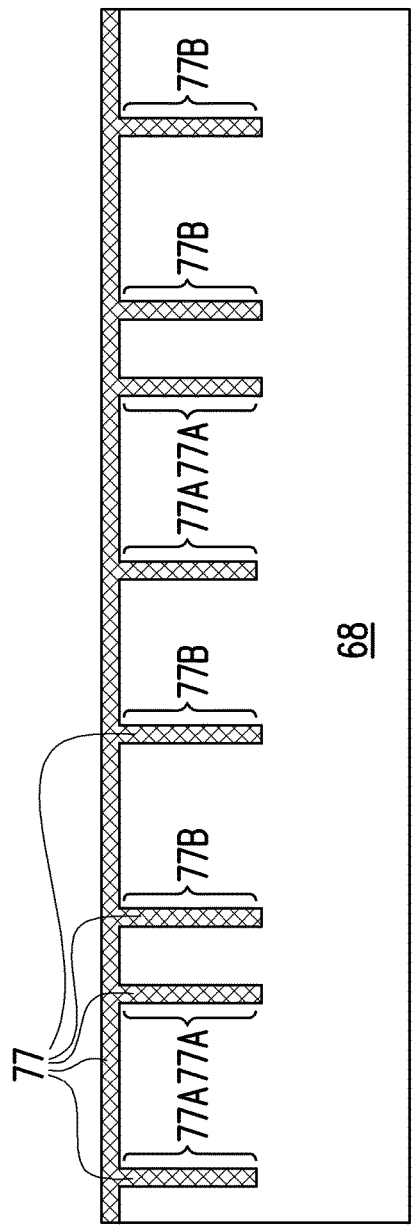
Figure 7E:
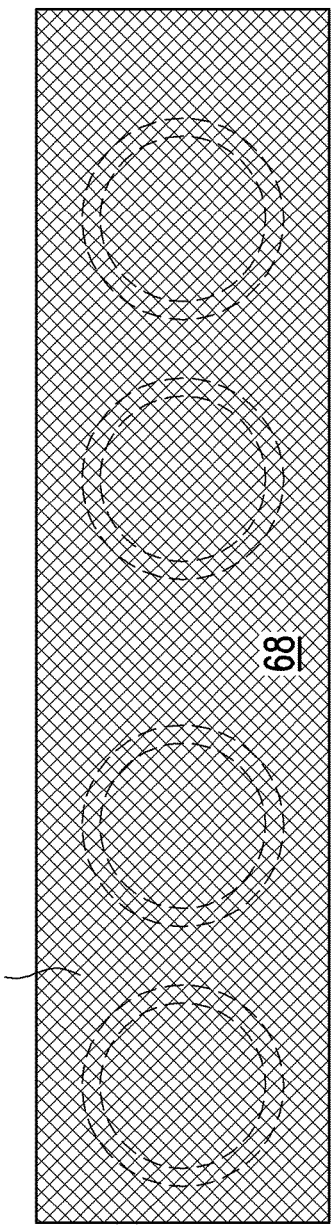

Next, as shown in FIGS. 7D and 7E, a thermal oxidation is performed to form oxide regions 77, which may be silicon oxide regions. Due to the volume increase in the thermal oxidation, openings 69A and 69B are filled by the oxide regions, which forms oxide rings, and are referred to as oxide rings 77A and 77B, respectively. Oxide region 77 also includes a portion on top of semiconductor plate 68.

Figure 2:
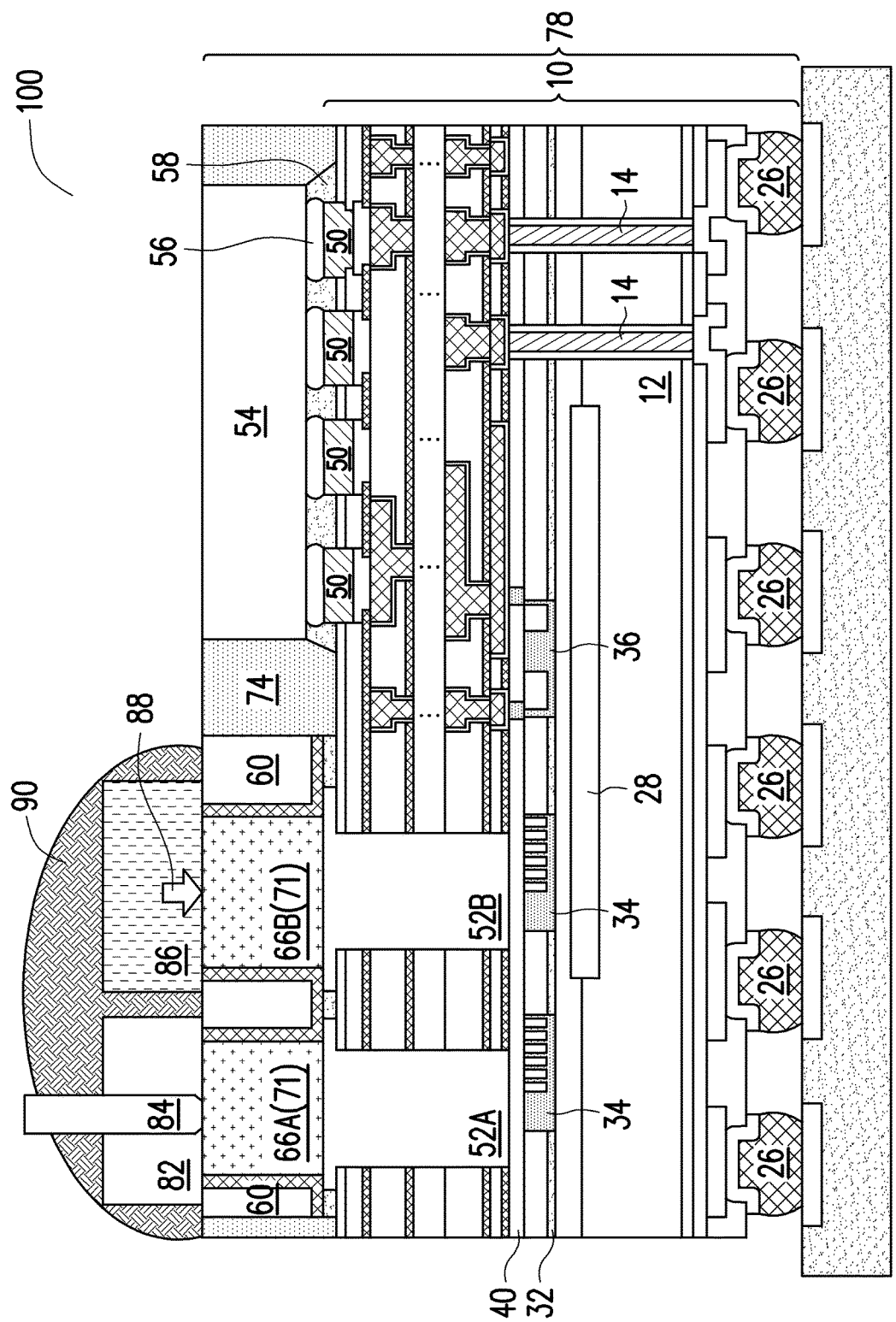
FIGS. 2 and 3 illustrate the packages including both optical devices and electrical devices in accordance with some embodiments.
Figure 7F:
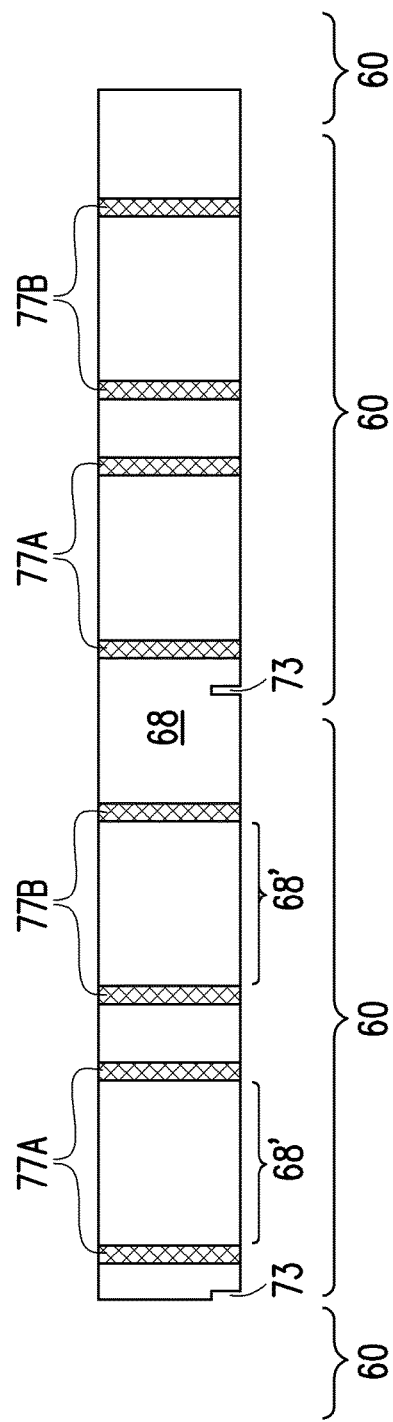
Figure 7G:
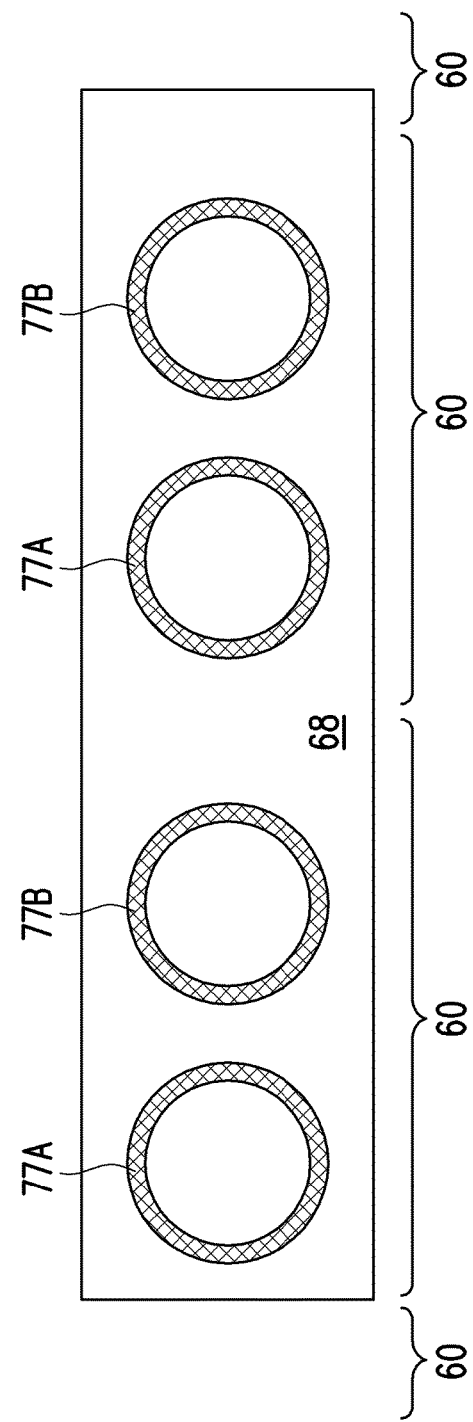

Next, as shown in FIGS. 7F and 7G, at least some horizontal portions of oxide regions 77 are removed. In accordance with some embodiments of the present disclosure, the horizontal portions of oxide region 77 are removed in a CMP or mechanical polish step. Semiconductor portions 68' are thus exposed. Alternatively, an etching is performed to remove portions of oxide region 77 covering portions 68', while leaving other portions of oxide region 77 not etched. Semiconductor plate 68 is then sawed into adapters 60, which are used in the structure in FIG. 2. In accordance with these embodiments, oxide rings 77A and 77B form waveguides for conducting light, and semiconductor portions 68' are the transparent material 71 (in openings 66A and 66B) as shown in FIG. 2. The bonding of the respective adapter 60 to the underlying photonic die 10 (FIG. 2) may be fusion bonding.

After the adapter 60 as shown in FIG. 6C or FIG. 7A is attached to photonic die 10, an encapsulation process is performed to encapsulate adapter 60 and electronic die 54 in encapsulating material 74, as shown in FIG. 1D. The respective step is illustrated as step 208 in the process flow shown in FIG. 10. Encapsulating material 74 may be a molding compound, which may include a base material (a polymer or resin) and a filler in the base material. The filler may be spherical particles.

Figure 1E:
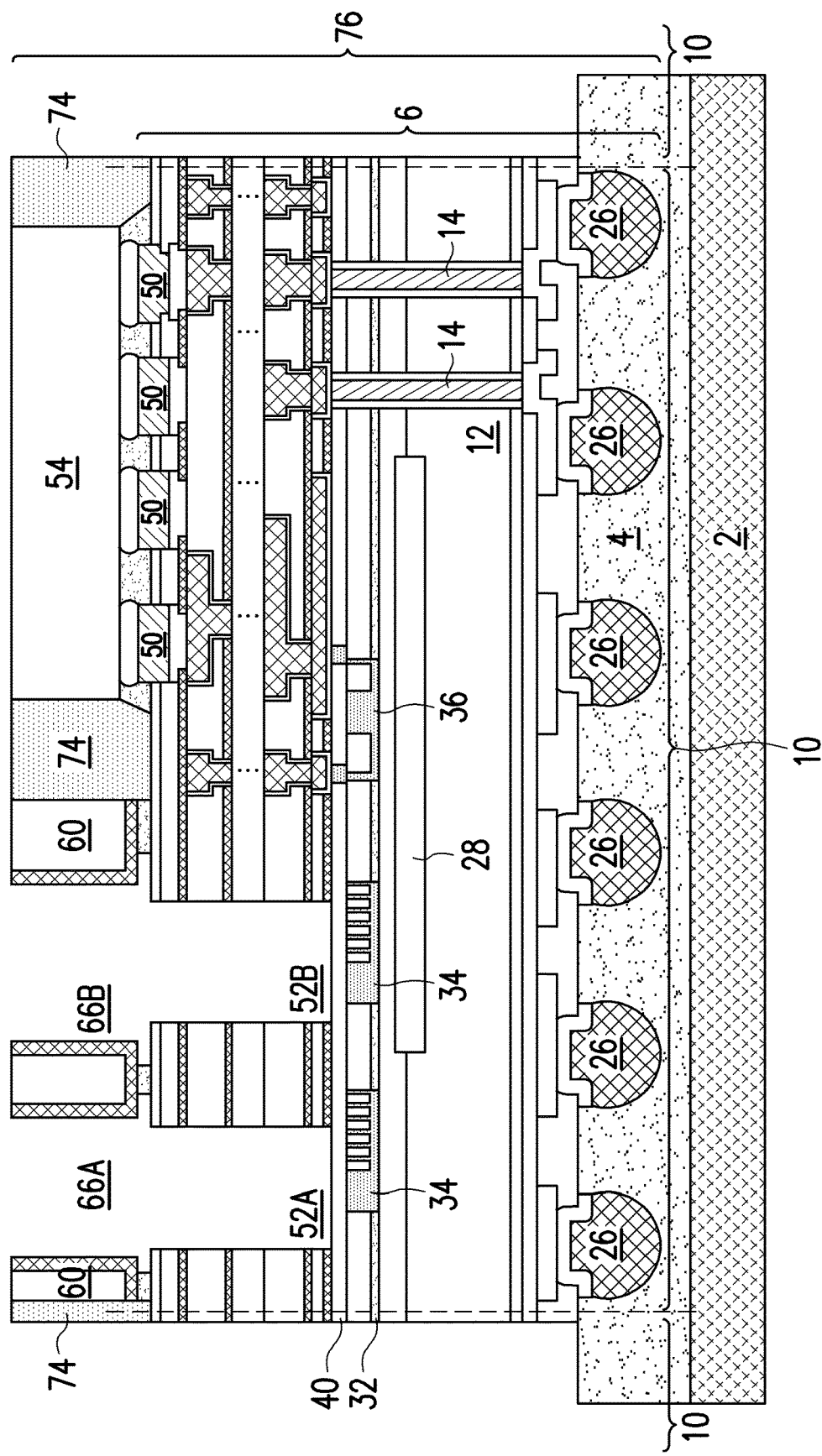

FIG. 1E illustrates the planarization of encapsulating material 74, which may be performed through CMP or mechanical grinding. The respective step is illustrated as step 210 in the process flow shown in FIG. 10. During the planarization, encapsulating material 74, adapter 60, and possibly electronic die 54 are thinned. As a result, openings 52A, 52B, 66A, and 66B are exposed. Openings 66A and 66B penetrate through adapter 60, and hence become through-holes. In the resulting structure, the top surfaces of encapsulating material 74, adapter 60, and electronic die 54 are coplanar with a planar surface. This provides the advantageous features for subsequent process steps, in which the planar surface may be placed on another carrier (not shown) in order to perform some process steps (for example, the steps shown in FIGS. 5C and 5D). In addition, since electronic die 54 is attached to a part of photonic die 10, photonic die may have warpage under stress, causing the cold joint between electronic die 54 and photonic die 10. Photonic die 10 may also crack under the stress. The adoption of adapter 60 also reduces the stress (particular when the CTE of adapter 60 is close to that of photonic die 10 and electronic die 54).

The process steps shown in FIGS. 1A through 1E are at wafer level. Accordingly, in the steps shown in FIGS. 1B and 1C, a plurality of identical electronic dies 54 and a plurality of identical adapters 60 are attached to a plurality of photonic dies 10 in wafer 6. As a result, the structure shown in FIG. 1E is also at wafer level, and the resulting structure over adhesive 4 is referred to as composite wafer 76.

Figure 1F:
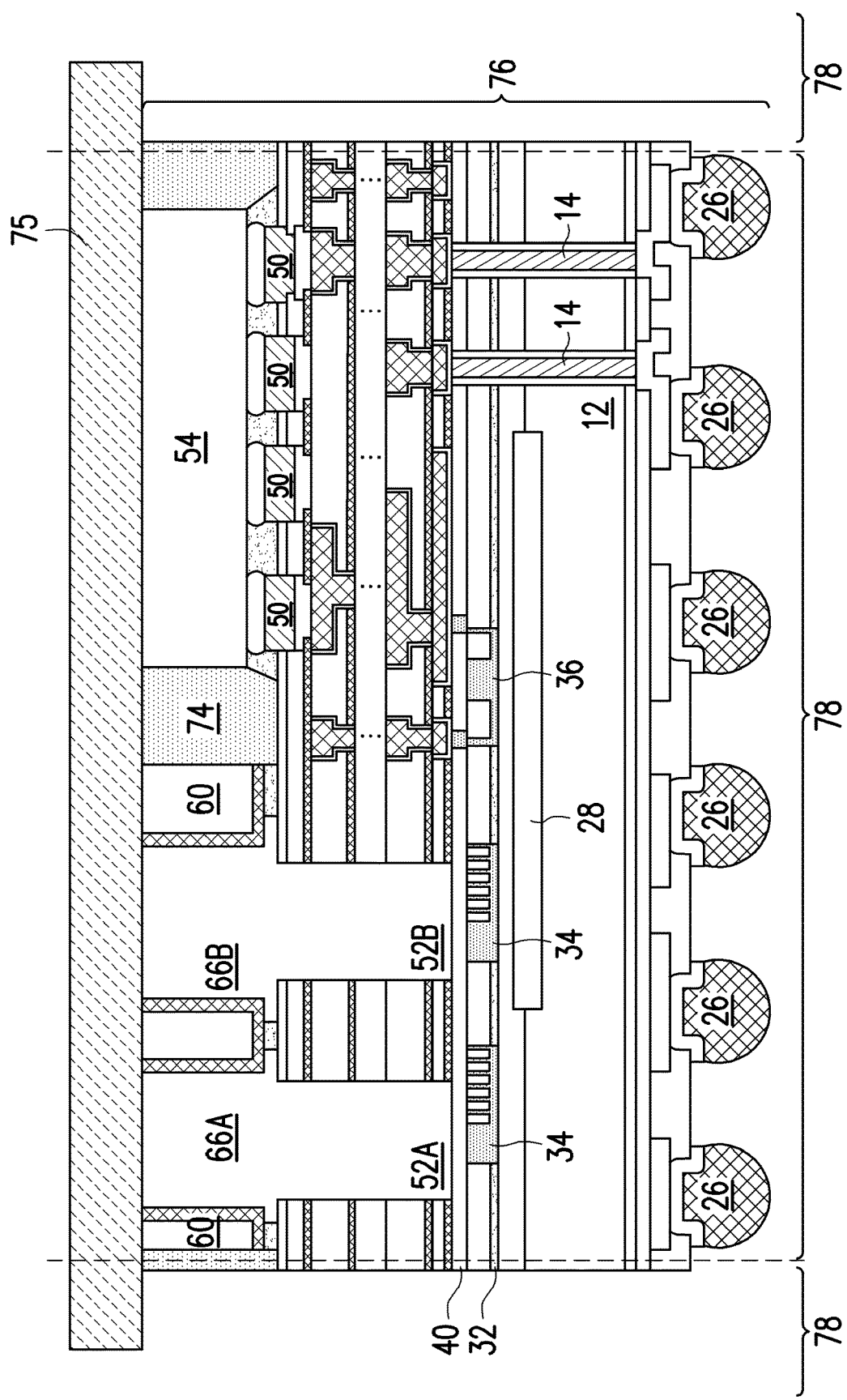
Figure 1G:
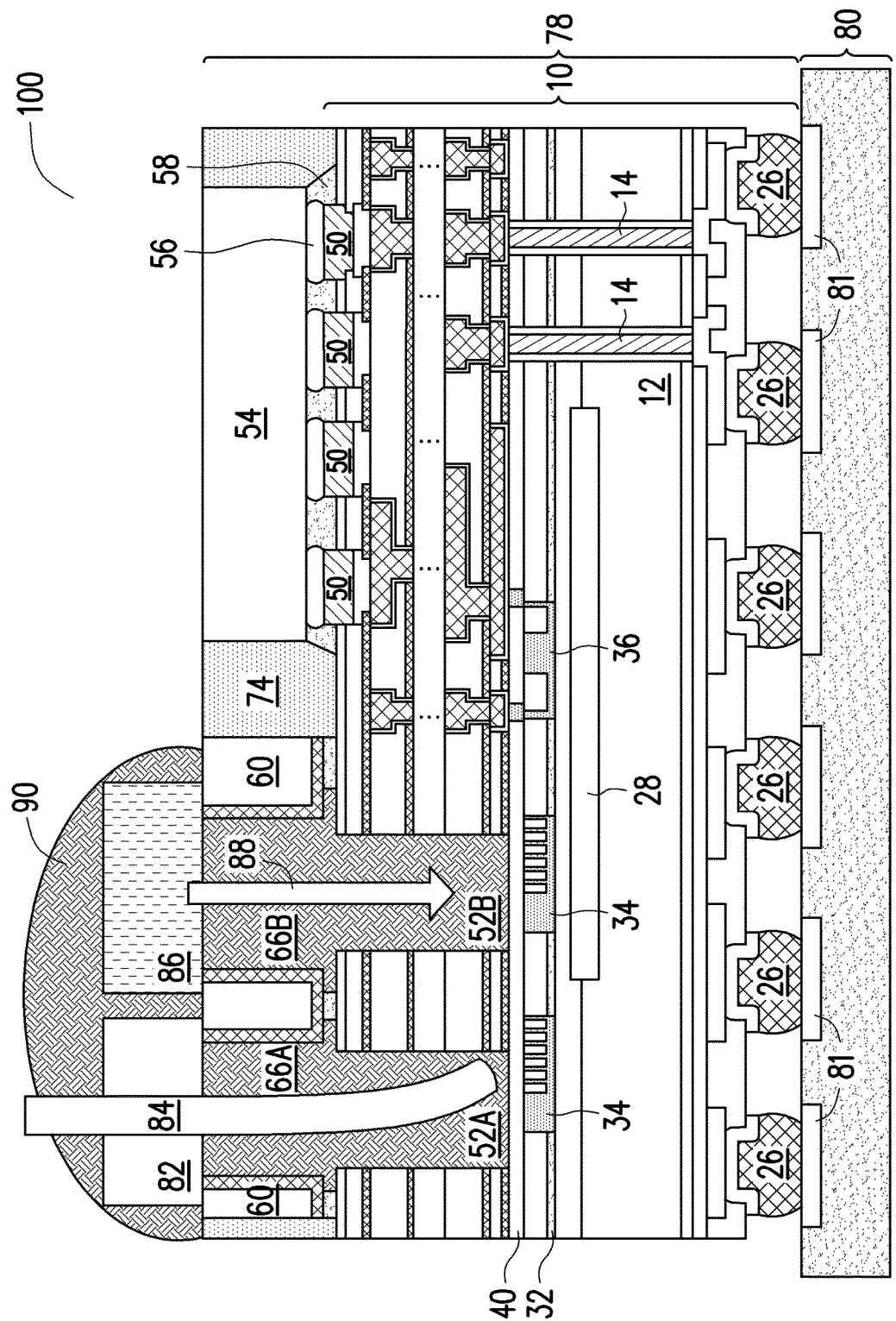

Composite wafer 76 is then de-mounted from carrier 2, and is attached to dicing tape 75, as shown in FIG. 1F. Next, composite wafer 76 is singulated to generate a plurality of packages 78, which are identical to each other. The respective step is illustrated as step 212 in the process flow shown in FIG. 10.

FIG. 1G illustrates the bonding of package 78 to package component 80, which may be a package substrate, a printed circuit board, or the like. Solder regions 26 are reflowed to join bond pads 81 in package component 80.

Also, coupler 82 and lamp 86 are attached to package 78. The respective step is illustrated as step 214 in the process flow shown in FIG. 10. Coupler 82 is aligned to holes 66A and 52A. Coupler 82 is used for the input/output of optical signals for photonic die 10. Coupler 82 includes optical fiber 84, which represents one or a plurality of optical fibers. Optical fiber 84 may penetrate through opening 66A and extend into opening 52A, and optical fiber 84 is optically coupled to the underlying grating coupler 34. Either the light transmitted in optical fiber 84 is projected onto grating coupler 34, or the light emitted out of grating coupler 34 is received by optical fiber 84.

In addition, radiation source 86, which may be a lamp, and hence is alternatively referred to as lamp 86, is attached to photonic die 10, and is aligned to holes 66B and 52B. Lamp 86 is configured to project light 88 (which may be a laser beam) into openings 66B and 52B, with light 88 being projected onto one or a plurality of underlying grating couplers 34.

In accordance with some embodiments of the present disclosure, optical adhesive 90, which is a clear (and hence is transparent) adhesive, is used to fix coupler 82 and lamp 86 onto photonic die 10. Optical adhesive 90 may be filled into openings 66A, 66B, 52A, and 52B also. Alternatively, optical adhesive 90 may be dispensed over and surrounding coupler 82 and lamp 86, while leaving openings 66A, 66B, 52A, and 52B as air gaps in the final product. Package 100 is thus formed.

FIGS. 2, 3, 4A-4D, and 5A-5D illustrate the cross-sectional views of intermediate stages in the formation of packages in accordance with some embodiments of the present disclosure. Unless specified otherwise, the materials and the formation methods of the components in these embodiments are essentially the same as the like components, which are denoted by like reference numerals in the embodiments shown in FIGS. 1A through 1G. The details regarding the formation process and the materials of the packages may thus be found in the discussion of the embodiment shown in FIGS. 1A through 1G.

FIG. 2 illustrates package 100 in accordance with some embodiments of the present disclosure. The adapter 60 in accordance with these embodiments is formed using the process shown in FIG. 7A or the process shown in FIGS. 7B through 7G. Accordingly, the adapter 60 as shown in FIG. 2 includes transparent filling material 71. Transparent filling material 71 overlaps openings 52A and 52B, which are also air gaps. After the encapsulation and the planarization, filling material 71 in adapter 60 is exposed. Accordingly, in accordance with these embodiments, through-holes 66A and 66B are filled with transparent filling material 71. Coupler 82 and lamp 86 are then attached. In accordance with these embodiments, optical fiber 84 has a bottom end level with or higher than the top surface of adapter 60. The light projected from one of optical fibers 84 passes through transparent filling material 71, and is received by one of grating couplers 34. The light projected from one of grating couplers 34 may also pass through transparent filling material 71, and is received by a corresponding one of optical fibers 84. A two-way optical communication is achieved. In accordance with these embodiments, optical adhesive 90 is also used to fix coupler 82 and lamp 86. Since there is no opening in adapter 60. Openings 52A and 52B may not be filled with optical adhesive 90, and may remain as air gaps in the final product.

Figure 3:
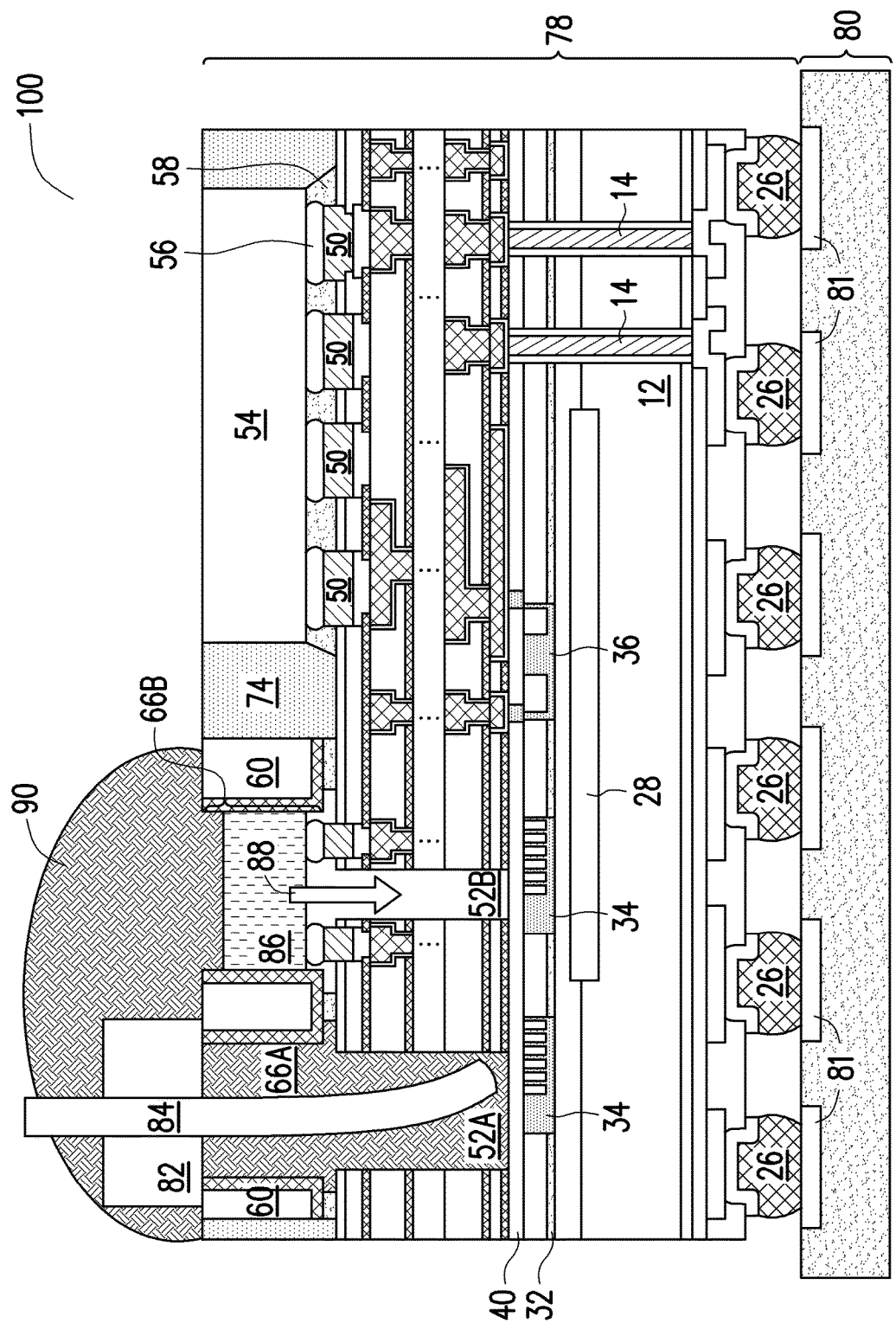

FIG. 3 illustrates package 100 in accordance with some embodiments of the present disclosure. Some of the lamps, which are discrete components, are small and thin enough, and hence can fit inside opening 66B in the final product without having any portion protruding higher than the top surface of adapter 60. In accordance with some embodiments of the present disclosure, lamp 86 is bonded to photonic die 10 through bond pads. Adapter 60 is then attached, followed by the encapsulation and planarization. During the attachment of adapter 60, lamp 86 is inserted into opening 66B. Lamp 86 receives power from the underlying photonic die 10, and no external line is needed to provide power to lamp 86. Accordingly, the co-planarity of package 78 is not adversely affected by lamp 86. Coupler 82 is then attached, and optical adhesive 90 is also dispensed to fix coupler 82. Optical adhesive 90 may be dispensed into openings 66A and 52A, and may or may not be dispensed into opening 52B. Accordingly, opening 52B may be left as an air gap, or filled with optical adhesive 90.

The embodiments shown in FIGS. 1A through 1G are performed at wafer level. Accordingly, during the process shown in FIGS. 1A through 1E, photonic die 10 is part of an un-sawed wafer 6, which includes a plurality of photonic dies 10. The wafer is sawed in the step shown in FIG. 1F. FIGS. 4A through 4D illustrate a die-level formation of package 100 in accordance with some embodiments of the present disclosure.

Figure 4A:
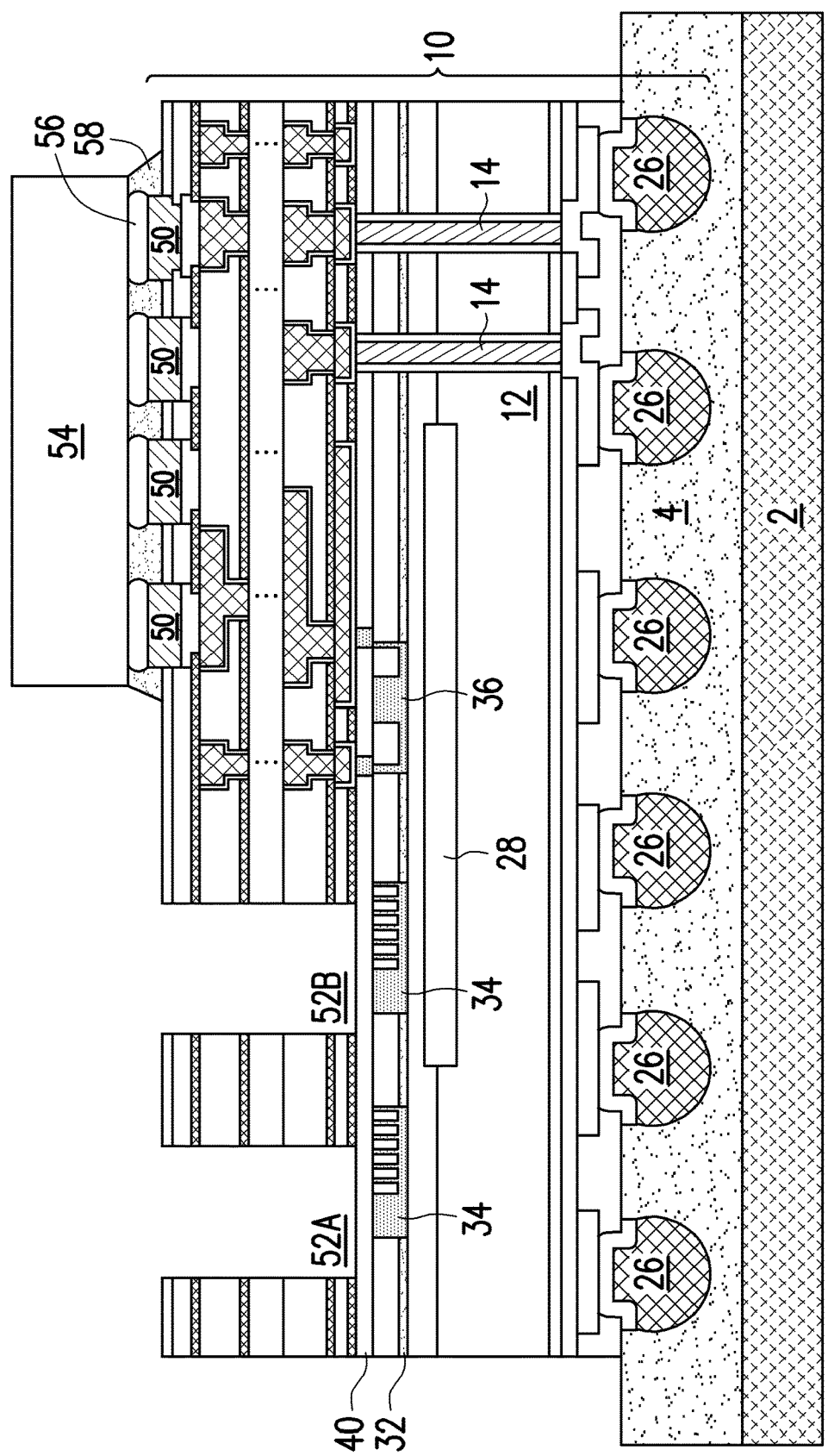
FIGS. 4A through 4D illustrate the cross-sectional views of intermediate stages in the formation of a chip-on-chip package including both optical devices and electrical devices in accordance with some embodiments.

In FIG. 4A, discrete photonic die 10, which has already been sawed from the respective wafer, is placed over carrier 2, which is a much smaller carrier than the carrier 2 shown in FIG. 1A. Holes 52A and 52B are formed in photonic dies, and holes 52A and 52B may be formed before the sawing of the wafer in accordance with some embodiments. In accordance with alternative embodiments, holes 52A and 52B are formed after the sawing of the wafer. Electronic die 54 is bonded to photonic die 10, and underfill 58 is dispensed and cured.

Figure 4B:
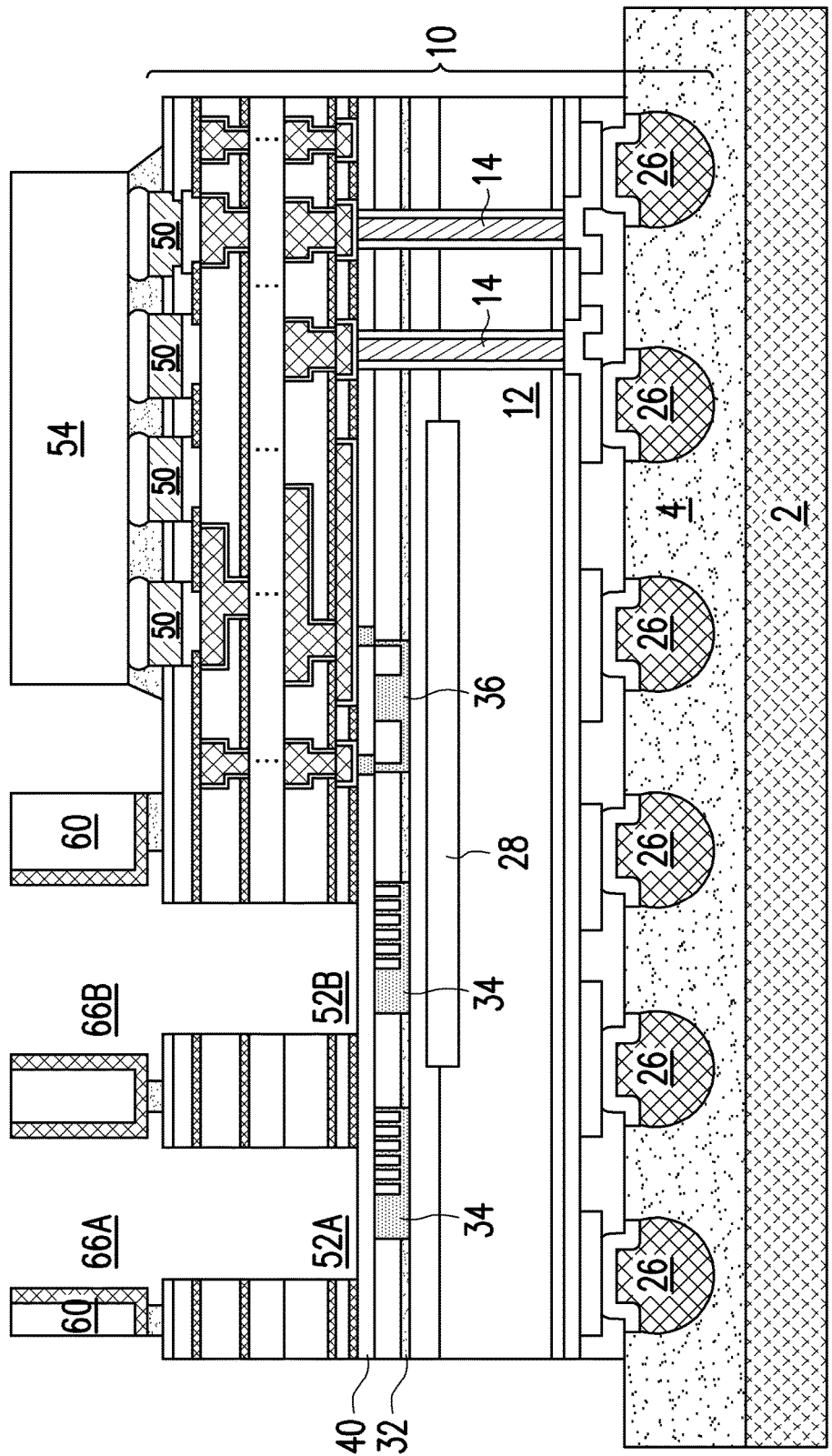

Next, referring to FIG. 4B, adapter 60 is attached to photonic die 10, for example, through adhesion using an adhesive or through dielectric-to-dielectric bonding. The adapter 60 in accordance with some embodiments may be formed by performing the steps shown in FIGS. 6A through 6C first, and then performing a CMP or grinding to remove excess portions of plate 68, so that openings 52A and 52B become through-openings that penetrate through plate 68. Plate 68 is then sawed apart into a plurality of adapters 60, with one of the adapters 60 having the structure shown in FIG. 4B. The height of adapter 60 is selected during the CMP of plate 68, so that the top surface of adapter 60 is planar with the top surface of die 54 as much as possible.

Figure 4C:
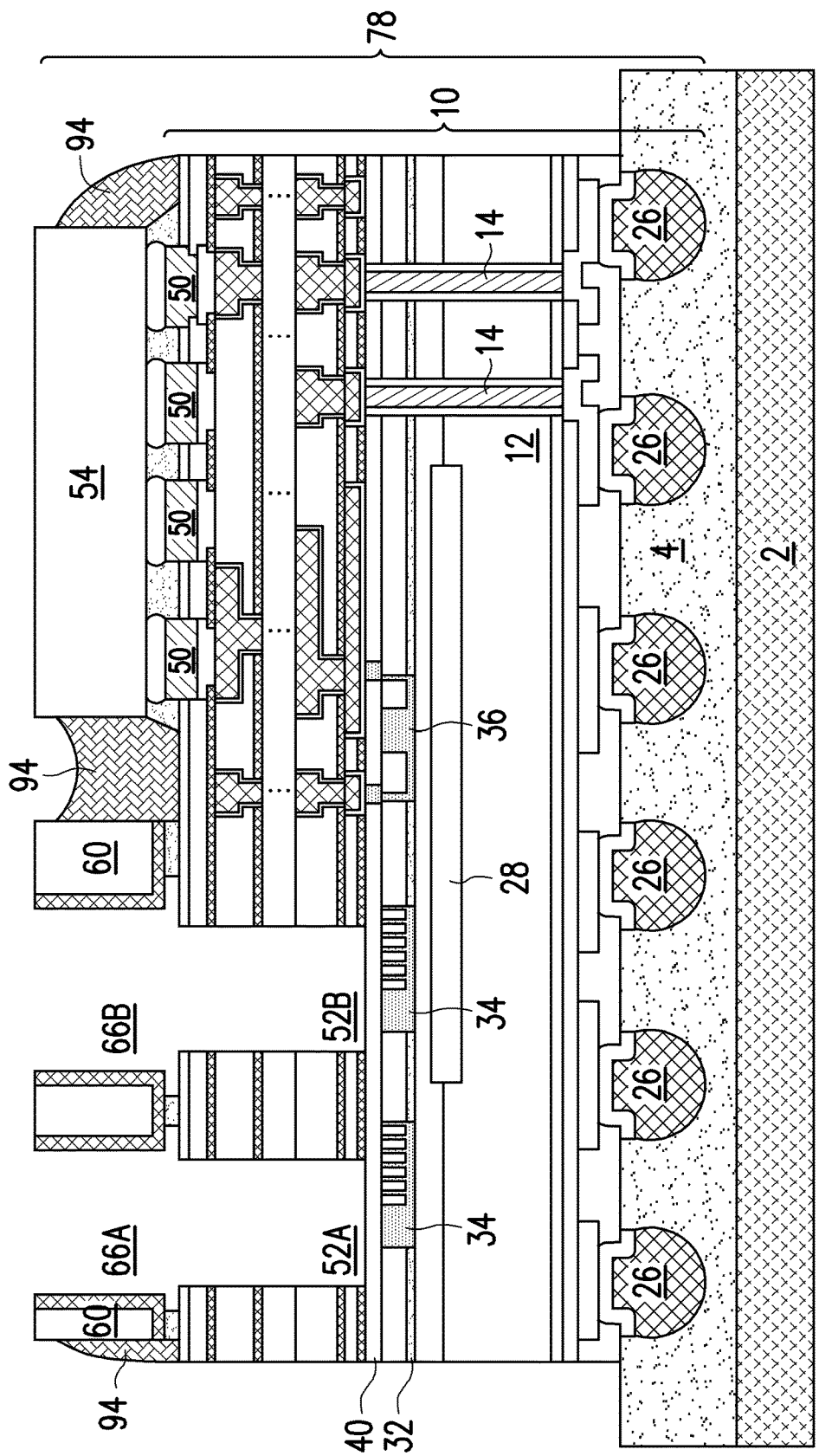

Referring to FIG. 4C, adhesive 94 is dispensed between adapter 60 and electronic die 54, so that adapter 60 and electronic dies 54 are structurally joined. Adhesive 94 may also be dispensed to encircle (when viewed in the top view) each of adapter 60 and electronic die 54. The top surface of adhesive 94 is slightly lower than the top surfaces of adapter 60 and electronic dies 54. Package 78 is thus formed.

Figure 4D:
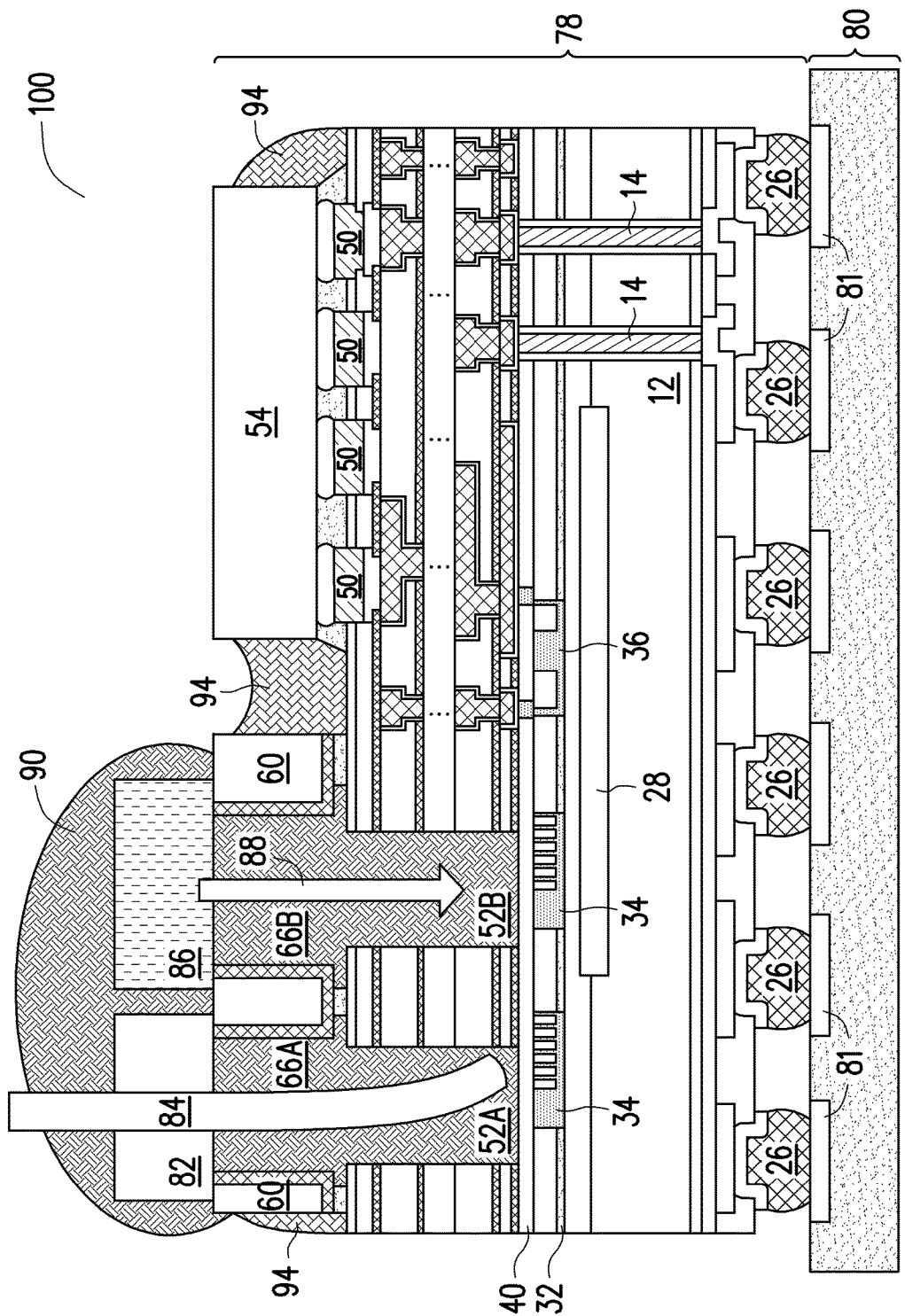

In FIG. 4D, coupler 82 and lamp 86 are attached to package 78, and optical adhesive 90 is dispensed. Furthermore, package 78 is bonded to package component 80. Package 100 is thus formed.

Figure 5A:
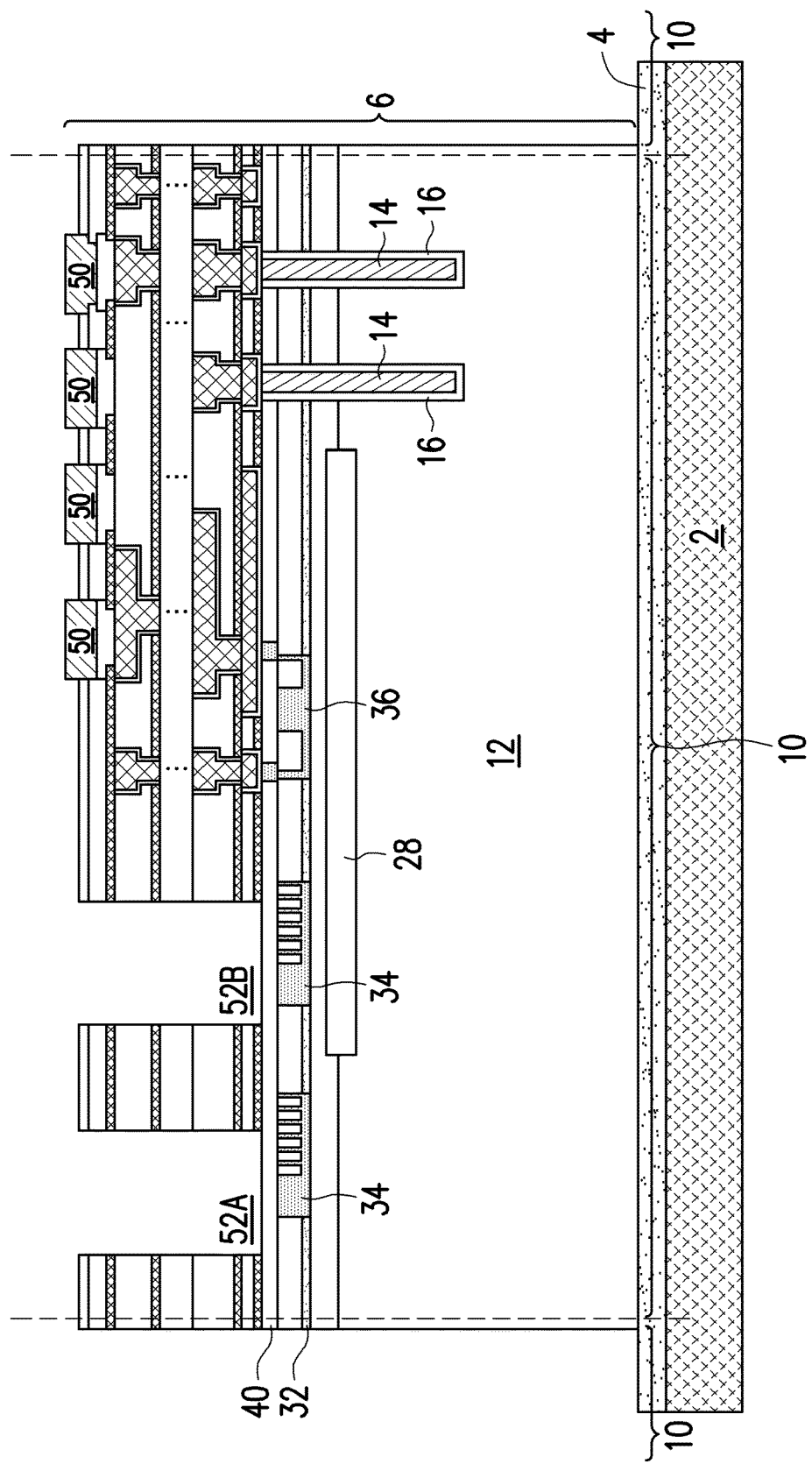
FIGS. 5A through 5D illustrate the cross-sectional views of intermediate stages in the formation of a chip-on-wafer package including both optical devices and electrical devices in accordance with some embodiments.

The embodiments shown in FIGS. 1A through 1G are referred to as a solder-first process (or C4-first process since solder regions 26 are sometimes referred to as C4 bumps), in which solder regions 26 are formed before the bonding/attaching of electronic die 54 and adapter 60. FIGS. 5A through 5D illustrate the intermediate steps of a solder-last process, in which solder regions are formed after electronic die 54 and adapter 60 are bonded/attached to photonic die 10. Referring to FIG. 5A, an un-sawed wafer 6, which includes a plurality of photonic dies 10, is mounted on carrier 2 through adhesive 4. In photonic die 10, TVs 14 extend to an intermediate level of substrate 12, and do not penetrate through substrate 12 at this time.

Figure 5B:
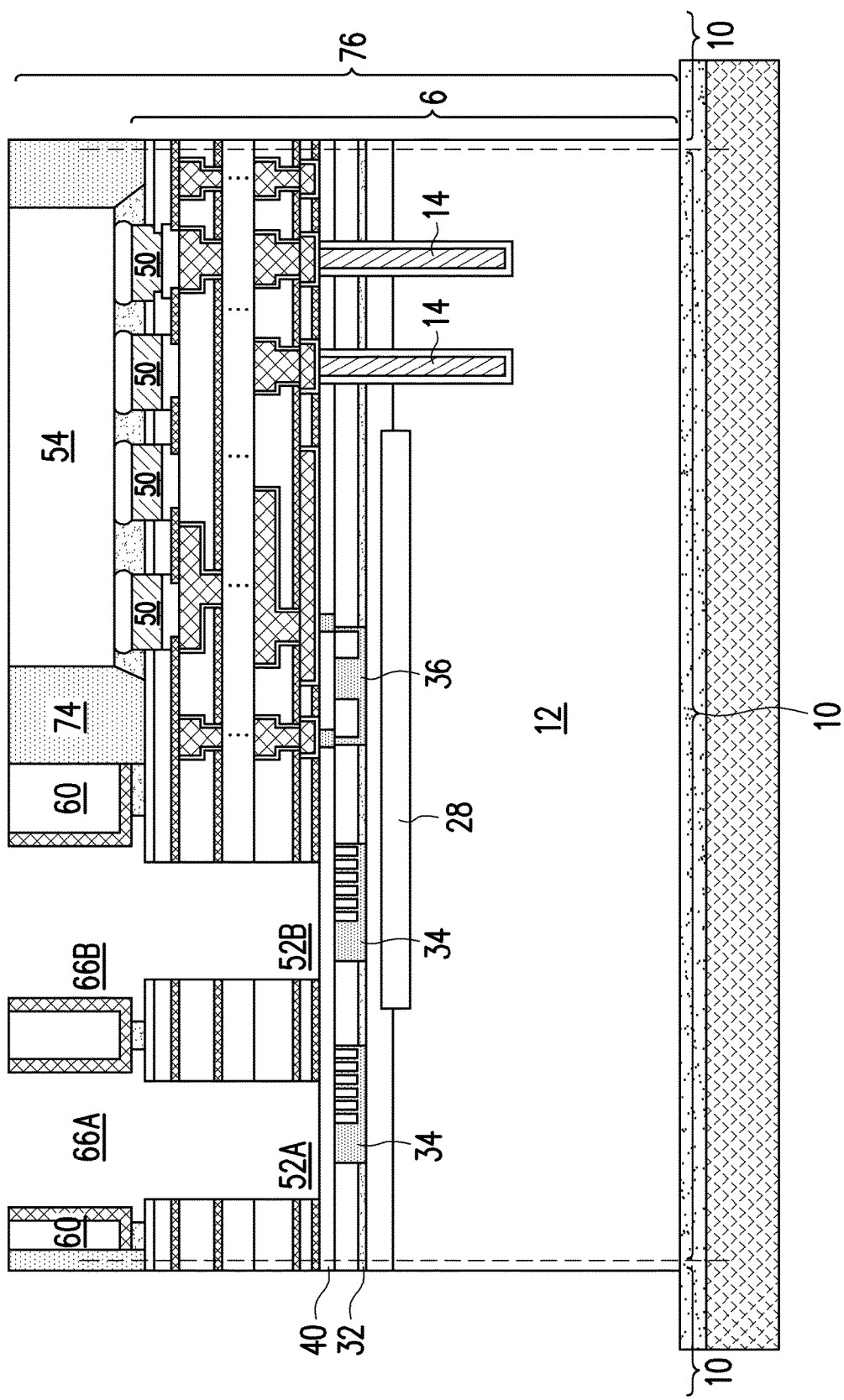

Next, the process steps shown in FIGS. 1B through 1E are performed, resulting in the structure shown in FIG. 5B. The process steps and the materials may be found in the discussion of the embodiments shown in FIGS. 1B through 1E, and hence are not repeated herein. Composite wafer 76 is thus formed.

Figure 5C:
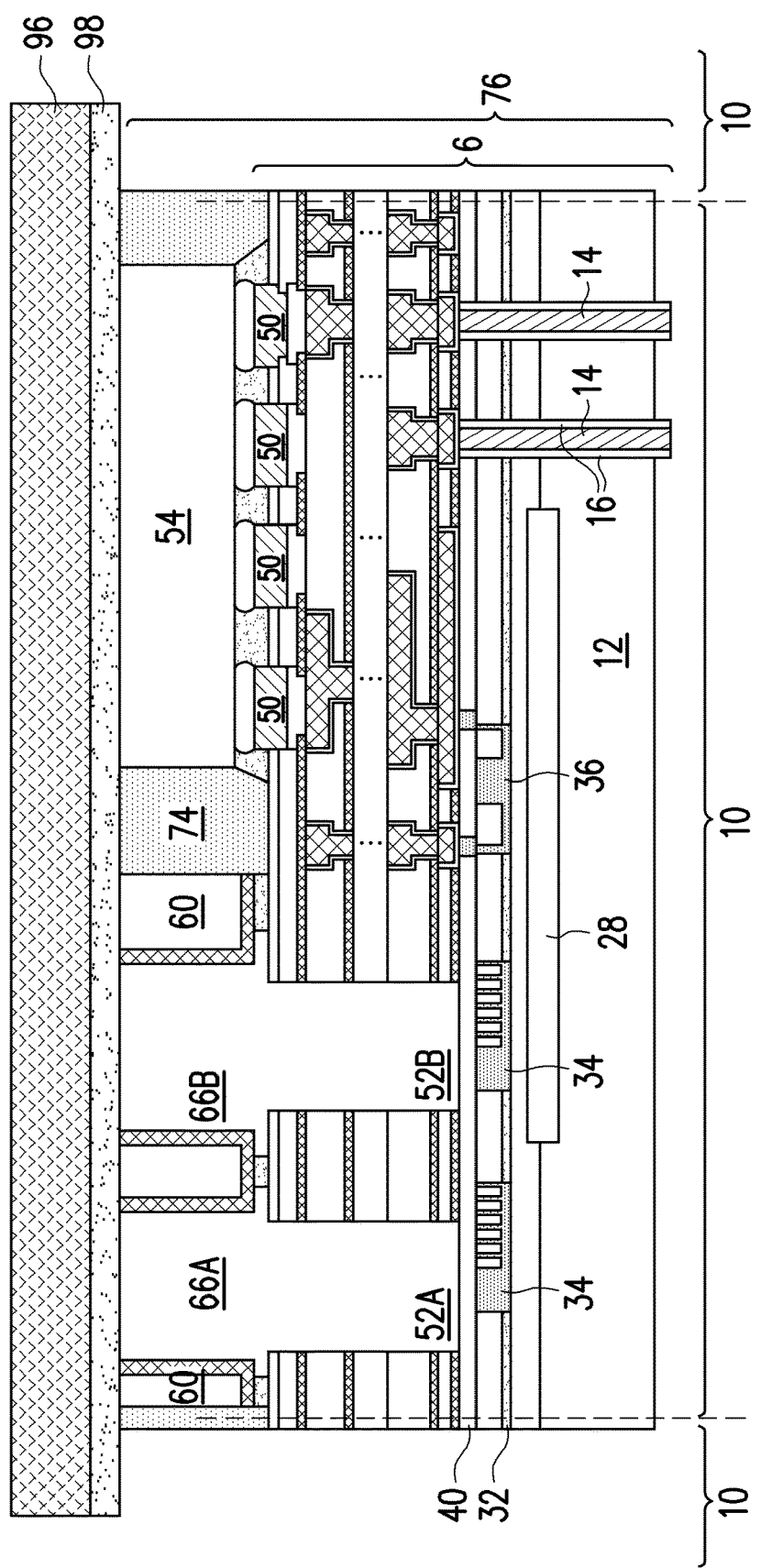
Figure 5D:
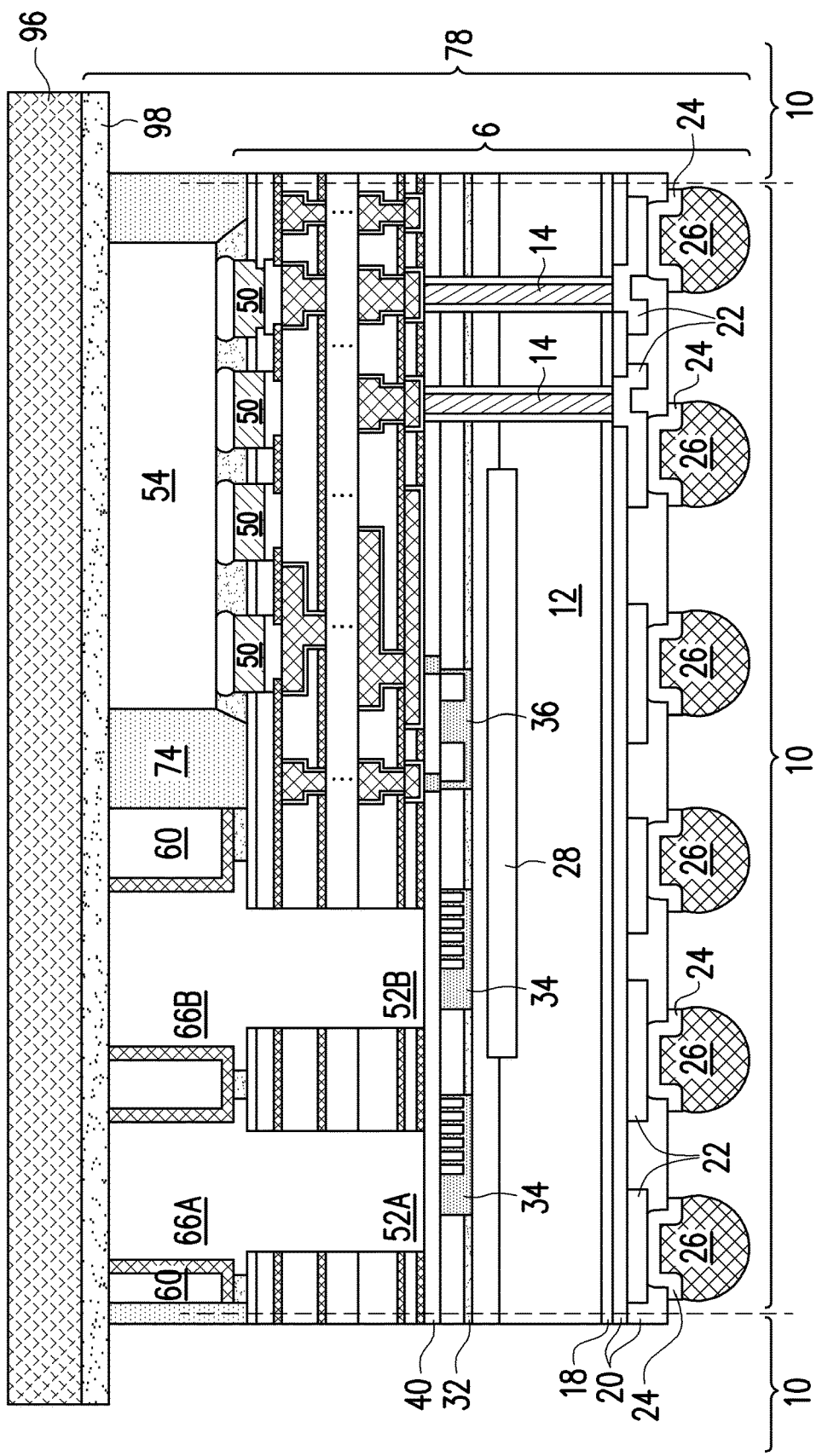

A carrier swap is then performed, in which carrier 96 (FIG. 5C) is first attached to the composite wafer 76, for example, through adhesive 98, followed by the demounting of composite wafer 76 from carrier 2 (FIG. 5B). The resulting structure is shown in FIG. 5C. Next, a backside grinding is performed to remove some backside portions of substrate 12, and hence TVs 14 are exposed. Substrate 12 may then be etched slightly so that TVs 14 protrude out of the back surface of substrate 12. In subsequent steps, dielectric layers 18 and 20, RDLs 22, UBMs 24, and solder regions 26 are formed. The resulting composite wafer 76 is shown in FIG. 5D.

In a subsequent step, composite wafer 76 is demounted from carrier 96. The subsequent steps are essentially the same as shown in FIGS. 1F and 1G, and hence are not repeated herein. The resulting package is essentially the same as shown in FIG. 1G.

It is noted that in accordance with various embodiments discussed above, some of the components in the packages 100 have different variations. For example, adapter 60 may or may not include a transparent filling material in its openings, the package 100 may be formed at wafer-level or at die-level, and may be formed using solder-first or solder-last process. Lamp 86 may be placed over adapter 60 or inserted into adapter 60. These process steps and structures in accordance with the variations of embodiments may be mixed in any combination whenever applicable. For example, in the embodiments shown in FIGS. 4A through 4D and 5A through 5D, the transparent filling material (FIG. 2) may be adopted, or lamp 86 may be inserted into adapter 60 similar to the embodiments in FIG. 3.

Figure 8:
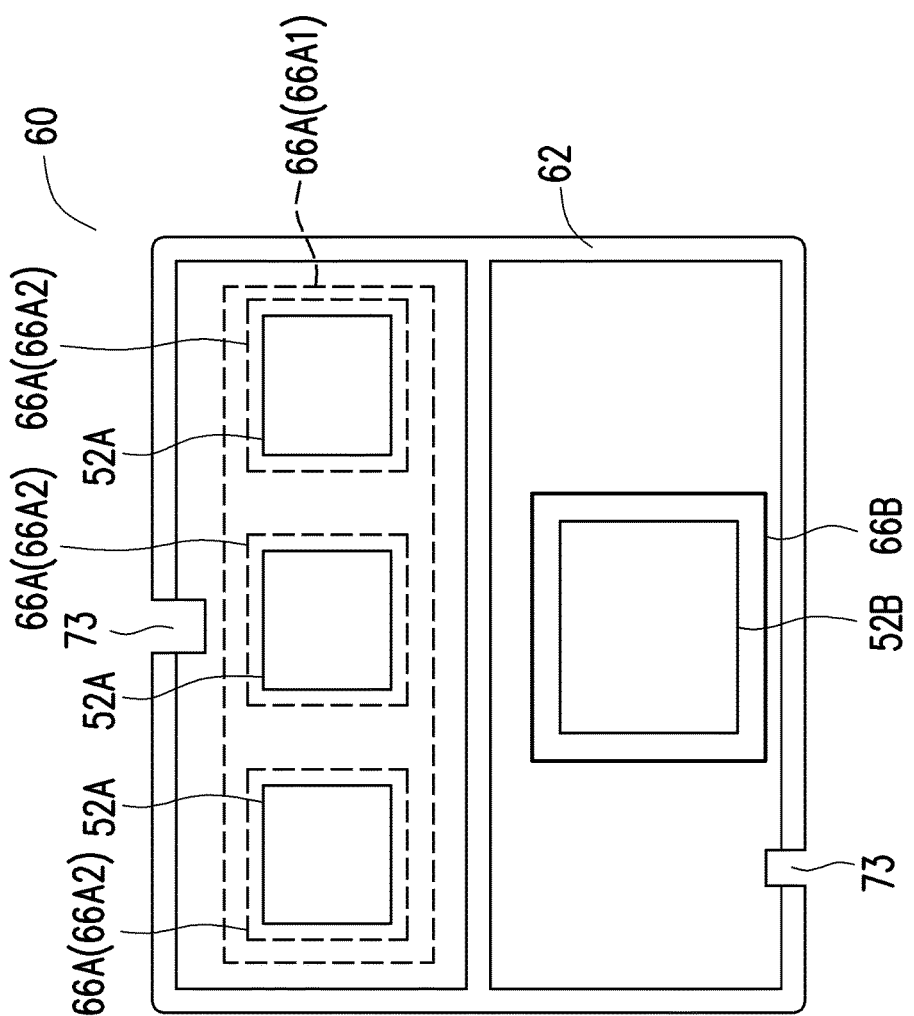
FIGS. 8 and 9 illustrate top views of some adapters and the corresponding Grating Coupler (GC) holes in accordance with some embodiments.

FIG. 8 illustrates the top view of the portion of adapter 60 in package 100 in accordance with some exemplary embodiments. In accordance with some embodiments of the present disclosure, one opening 66A (marked as 66A1) overlaps a plurality of openings 52A, and each of openings 52A may be used for inserting one optical fiber therein. In accordance with other embodiments of the present disclosure, a plurality of openings 66A2 are formed, and each opening 66A2 overlap one opening 52A with a one-to-one correspondence, with each of openings 52A/66A2 being used for inserting one optical fiber therein. Opening 66B corresponds to one opening 52B in accordance with some embodiments.

Figure 9:
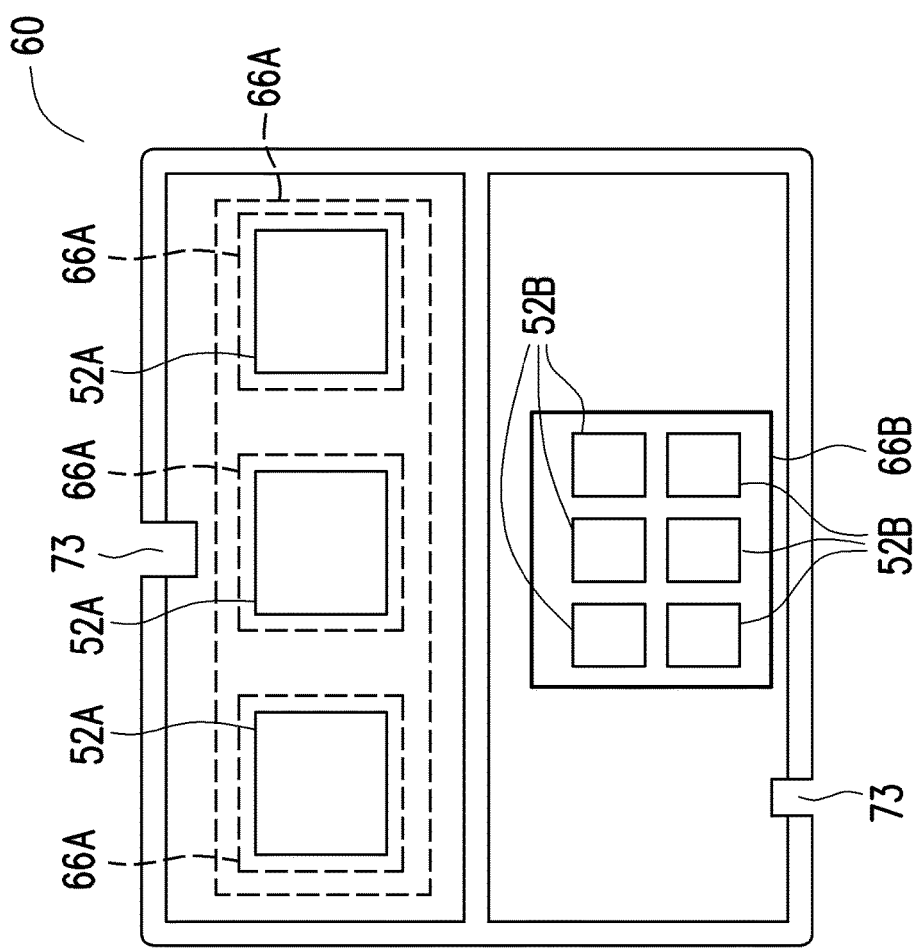

FIG. 9 illustrates the top view of adapter 60 in accordance with alternative embodiments. This structure is similar to the structure shown in FIG. 8, except opening 66B corresponds to a plurality of openings 52B.

In accordance with some embodiments of the present disclosure, some exemplary processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. The adoption of the adapter may result in a planar top surface, which may be adhered to carrier in some process steps such as in the formation of solder regions in solder-last process. In addition, the adapter may reduce and balance the stress in the resulting structure, particularly when the CTE of the adapter is similar to that of the interposer die and the electronic die. The problem resulting from the stress is thus avoided.

In accordance with some embodiments of the present disclosure, a method includes bonding an electronic die to a photonic die, wherein the photonic die comprises a first opening; attaching an adapter onto the photonic die, wherein a portion of the adapter is at a same level as a portion of the electronic die; forming a through-hole penetrating through the adapter, wherein the through-hole is aligned to the first opening; and attaching an optical device to the adapter, wherein the optical device is configured to emit a light into the photonic die or receive a light from the photonic die. In an embodiment, the method further includes after the adapter is attached to the photonic die, encapsulating the electronic die and the adapter in an encapsulating material; and performing a planarization to remove top portions of the adapter and the electronic die, wherein the through-hole is exposed after the planarization. In an embodiment, the optical device comprises a coupler, and in the attaching the optical device, an optical fiber of the coupler extends into the through-hole and the first opening. In an embodiment, the photonic die further comprises a second opening, and the adapter further comprises an additional through-hole aligned to the second opening, and the method further comprises attaching a lamp aligned to the second opening. In an embodiment, the photonic die is a discrete die that has been sawed from a wafer, and the method further comprises: after the adapter is attached to the photonic die, dispensing an adhesive between the adapter and the electronic die. In an embodiment, the attaching the optical device to the adapter comprises disposing at least a portion of the optical device overlapping the adapter. In an embodiment, the photonic die further comprises a second opening, and the method further comprises: bonding a lamp to the photonic die, wherein after the adapter is attached, the lamp is located in the second opening in the adapter. In an embodiment, the method further comprises forming the adapter comprising: forming an opening in a blank plate; forming a protection layer extending into the opening; and sawing the blank plate having the opening to form a plurality of adapters, with the adapter being one of the plurality of adapters.

In accordance with some embodiments of the present disclosure, a method includes forming an adapter, which includes forming a first opening in a blank plate; and forming a protection layer having a portion extending into the first opening; attaching the adapter onto a photonic die, wherein the photonic die is in a wafer; bonding an electronic die onto the photonic die; encapsulating the electronic die and the adapter in an encapsulating material; performing a planarization on the encapsulating material to expose the adapter, the first opening in the adapter, and the electronic die; and sawing the encapsulating material and the wafer to form a plurality of packages, wherein one of the packages comprises the adapter, the photonic die, and the electronic die. In an embodiment, the method further includes forming a second opening in the photonic die, wherein after the adapter is attached to the photonic die, the first opening is joined with the second opening to form a continuous opening. In an embodiment, the method further comprises attaching a coupler to the adapter, wherein an optical fiber of the coupler extends into the first opening. In an embodiment, the optical fiber of the coupler further extends into an additional opening in the photonic die. In an embodiment, the method further includes forming a through-via in the photonic die, wherein the through-via penetrates through a semiconductor substrate in the photonic die; and forming a solder region to electrically couple to the through-via. In an embodiment, the forming the adapter comprises forming a second opening in the adapter, and the method further comprises: attaching a lamp on top of the adapter, wherein the lamp is directly over the second opening. In an embodiment, the forming the adapter comprises forming a second opening in the adapter, and disposing a lamp inside the second opening of the adapter.

In accordance with some embodiments of the present disclosure, a package includes a photonic die comprising a first opening; an electronic die over and bonded to the photonic die; an adapter over and attached to the photonic die, wherein the adapter comprises a through-hole penetrating through the adapter, and the through-hole is aligned to the first opening; and an optical coupler, wherein a portion of the optical coupler overlaps the through-hole in the adapter. In an embodiment, a portion of the adapter is at a same level as a portion of the electronic die. In an embodiment, the photonic die further comprises a second opening, and the package further comprises a lamp overlapping the second opening. In an embodiment, the optical coupler comprises an optical fiber extending into the through-hole and the first opening. In an embodiment, the adapter comprises a silicon layer, with no active device and passive device formed on the silicon layer.

In accordance with some embodiments of the present disclosure, a method includes forming a first opening and a second opening in a photonic die; bonding an electronic die over the photonic die; attaching a silicon adapter onto the photonic die, wherein the silicon adapter is free from active devices and passive devices therein, and a third opening of the silicon adapter is directly over the first opening; and planarizing top surfaces of the silicon adapter and the electronic die, wherein a portion of the silicon adapter is removed to expose both the first opening and the second opening, and the third opening becomes a through-hole penetrating through the silicon adapter. In an embodiment, the method further includes encapsulating the silicon adapter and the electronic die in an encapsulating material, wherein in the planarizing, the encapsulating material, the silicon adapter and the electronic die are thinned. In an embodiment, the method further includes forming a protection layer on the silicon adapter, wherein the protection layer extends into the third opening. In an embodiment, the method further includes attaching an optical coupler to the silicon adapter, wherein the optical coupler is aligned to the first opening and the third opening. In an embodiment, the method further includes attaching a lamp to the silicon adapter, wherein the lamp is aligned to the second opening.

In accordance with some embodiments of the present disclosure, a package includes a photonic die comprising a first hole and a second hole; a silicon adapter over and attached to the photonic die, wherein the silicon adapter comprises a third hole and a fourth hole aligned to, and joined to, the first hole and the second hole, respectively; an optical coupler overlapping the first hole and the third hole; and a lamp overlapping the second hole and the fourth hole. In an embodiment, the silicon adapter is free from active devices and passive devices therein. In an embodiment, the optical coupler comprises an optical fiber extending into both the first hole and the third hole.

In accordance with some embodiments of the present disclosure, a package includes a photonic die comprising a first hole; an adapter over and attached to the photonic die, wherein the adapter comprises a second hole aligned to, and joined to, the first hole, and the adapter comprises a first top surface; a molding compound surrounding the adapter, wherein the molding compound comprises a second top surface; an optical adhesive over and contacting the first top surface and the second top surface; and an optical coupler overlapping the first hole, wherein the optical coupler has at least a portion in the optical adhesive. In an embodiment, the photonic die further comprises a third hole, and the adapter further comprises a fourth hole aligned and joined to the third hole, and the package further comprises a lamp overlapping the third hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a photonic die comprising a first hole and a second hole;
a silicon adapter over and attached to the photonic die, wherein the silicon adapter comprises a third hole and a fourth hole aligned to, and joined to, the first hole and the second hole, respectively;
an optical coupler comprising a portion overlapping the first hole and the third hole; and
a lamp overlapping the second hole and the fourth hole.

2. The package of claim 1, wherein the optical coupler further comprises an optical fiber, wherein the optical fiber extends into both of the first hole and the third hole.

3. The package of claim 1, wherein the silicon adapter comprises a dielectric liner lining sidewalls of the first hole and the second hole.

4. The package of claim 1 further comprising an adhesive adhering the silicon adapter to the photonic die.

5. The package of claim 1 further comprising an encapsulant encapsulating the silicon adapter therein.

6. The package of claim 5 further comprising an electronic die bonded to the photonic die, wherein the encapsulant further encapsulates the electronic die therein.

7. The package of claim 6 further comprising an underfill between the electronic die and the photonic die.

8. The package of claim 1 further comprising an optical adhesive filling the second hole and the fourth hole.

9. A package comprising:
a photonic die comprising a first hole;
an adapter over and attached to the photonic die, wherein the adapter comprises a second hole aligned to, and joined to, the first hole, and the adapter comprises a first top surface, wherein the adapter comprises:
a silicon-based structure; and
an oxide layer lining the second hole;
a molding compound encircling the adapter, wherein the molding compound comprises a second top surface;
an optical adhesive over and contacting the first top surface and the second top surface; and
an optical coupler comprising a potion overlapping the first hole, wherein the optical coupler is at least partially in the optical adhesive.

10. The package of claim 9, wherein the optical adhesive further extends into the first hole.

11. The package of claim 9, wherein the optical adhesive further extends into the second hole.

12. The package of claim 9, wherein the optical coupler comprises an optical fiber extending into the first hole and the second hole.

13. The package of claim 9, wherein the silicon-based structure comprises a bottom surface, and the oxide layer comprises a portion contacting the bottom surface of the silicon-based structure to form a horizontal interface.

14. The package of claim 9 further comprising an adhesive between and contacting the adapter and the photonic die.

15. The package of claim 14, wherein the molding compound is further in physical contact with the adhesive.

16. The package of claim 9 further comprising an electronic die bonded to the photonic die, wherein the electronic die is encapsulated in the molding compound.

17. A package comprising:
a photonic die;
an electronic die over and bonded to the photonic die;
an adapter over and attached to the photonic die;
an optical coupler aligned to a first portion of the adapter, wherein the optical coupler comprises an optical fiber configured to optically couple to a first optical device in the photonic die through the adapter; and
a radiation source over and aligned to a second portion of the adapter, wherein the radiation source is configured to optically couple to a second optical device in the photonic die through the adapter.

18. The package of claim 17, wherein top surfaces of the adapter and the electronic die are coplanar.

19. The package of claim 17 further comprising an encapsulant encapsulating the adapter and the electronic die therein, wherein top surfaces of the adapter, the encapsulant, and the electronic die are coplanar.

20. The package of claim 19, wherein the adapter comprises:
a silicon-based plate; and
a silicon oxide liner lining sidewalls of a first through-hole and a second through-hole of the silicon-based plate, wherein the optical coupler and the radiation source are optically coupled to the photonic die through the first through-hole and the second through-hole.

\* \* \* \* \*